(12) United States Patent  (10) Patent No.: US 7,777,519 B2
Pani et al.  (45) Date of Patent: Aug. 17, 2010

(54) PERMUTABLE SWITCHING NETWORK WITH ENHANCED MULTICASTING SIGNALS ROUTING FOR INTERCONNECTION FABRIC

(75) Inventors: Peter M. Pani, Mountain View, CA (US); Benjamin S. Ting, Saratoga, CA (US)

(73) Assignee: Advantage Logic, Inc., Cupertino, CA (US)

( * ) Notice: Subject to any disclaimer, the term of this patent is extended or adjusted under 35 U.S.C. 154(b) by 0 days.

(21) Appl. No.: 12/703,624

(22) Filed: Feb. 10, 2010

(65) Prior Publication Data

US 2010/0141298 A1 Jun. 10, 2010

Related U.S. Application Data

(63) Continuation of application No. 12/327,704, filed on Dec. 3, 2008, now Pat. No. 7,714,611.

(51) Int. Cl.
*H03K 19/177* (2006.01)
*H01L 25/00* (2006.01)
(52) U.S. Cl. .............................. 326/41; 326/38; 326/39
(58) Field of Classification Search ............. 326/38–41, 326/47
See application file for complete search history.

(56) References Cited

U.S. PATENT DOCUMENTS

| | | | |
|---|---|---|---|
| 4,758,745 A | 7/1988 | Elgamal et al. | |
| 4,870,302 A | 9/1989 | Freeman | |
| 5,144,166 A | 9/1992 | Camarota et al. | |
| 5,260,610 A | 11/1993 | Pedersen et al. | |
| 5,260,611 A | 11/1993 | Cliff et al. | |
| 5,396,126 A * | 3/1995 | Britton et al. | 326/41 |
| 5,457,410 A | 10/1995 | Ting | |
| 5,469,003 A | 11/1995 | Kean | |
| 5,825,202 A * | 10/1998 | Tavana et al. | 326/39 |
| 5,841,775 A | 11/1998 | Huang | |
| 5,883,526 A | 3/1999 | Reddy et al. | |
| 5,914,616 A | 6/1999 | Young et al. | |
| 6,051,991 A | 4/2000 | Ting | |
| 6,417,694 B1 | 7/2002 | Reddy et al. | |
| 6,507,217 B2 | 1/2003 | Ting | |
| 6,594,810 B1 | 7/2003 | Reblewski et al. | |
| 6,597,196 B2 | 7/2003 | Ting | |
| 6,693,456 B2 | 2/2004 | Wong | |
| 6,747,482 B2 | 6/2004 | Ting | |
| 6,940,308 B2 | 9/2005 | Wong | |
| 6,975,139 B2 | 12/2005 | Pani et al. | |
| 7,065,076 B1 | 6/2006 | Nemazie | |

(Continued)

OTHER PUBLICATIONS

International Search Report and Written Opinion of the International Searching Authority mailed Nov. 25, 2009 for PCT/US09/58818 filed Sep. 29, 2009, 17 pages.

(Continued)

*Primary Examiner*—Vibol Tan
*Assistant Examiner*—Crystal L Hammond
(74) *Attorney, Agent, or Firm*—Blakely, Sokoloff, Taylor & Zafman LLP

(57) ABSTRACT

In one embodiment, an integrated circuit has a L-level permutable switching network (L-PSN) comprising L levels of intermediate conductors. The integrated circuit can be used in electronic devices, such as switching networks, routers, and programmable logic circuits, etc.

12 Claims, 13 Drawing Sheets

U.S. PATENT DOCUMENTS

| | | |
|---|---|---|
| 7,123,612 B2 | 10/2006 | Lu |
| 7,142,012 B2 | 11/2006 | Ting |
| 7,256,614 B2 | 8/2007 | Pani et al. |
| 7,417,457 B2 | 8/2008 | Pani et al. |
| 7,423,453 B1 | 9/2008 | Ting et al. |
| 7,557,613 B2 | 7/2009 | Pani et al. |
| 2001/0007428 A1 | 7/2001 | Young et al. |
| 2002/0186044 A1 | 12/2002 | Agrawal et al. |
| 2009/0273368 A1* | 11/2009 | Pani et al. .................... 326/41 |

OTHER PUBLICATIONS

Shoup, R.G., "Programmable Cellular Logic Arrays", Abstract, Ph.D. Dissertation, Carnegie Mellon University, Pittsburg, Pennsylvania, Mar. 1970, pp. ii-121.

Spandorfer, L.M., "Synthesis of Logic Functions on an Array of Integrated Circuits", Contract: AF 19 (628) 2907, Project: 4645, Task: 464504, Final Report, Nov. 30, 1965.

Notice of allowance mailed Dec. 10, 2009 for U.S. Appl. No. 12/327,702, filed Dec. 3, 2008, 14 pages.

Notice of allowance mailed Dec. 10, 2009 for U.S. Appl. No. 12/327,704, filed Dec. 3, 2008, 15 pages.

* cited by examiner

101: (1, 2) → 141: (1, 2)
102: (2, 3) → 153: (2, 3)
103: (1, 3) → 165: (1, 3)
104: (1)    → 154: (1)
105: (3)    → 142: (3)
106: (2, 3) → 166: (2, 3)

141: (1, 2)
142: (3)
153: (2, 3)
154: (1)
165: (1, 3)
166: (2, 3)

```
101: (1, 2) → 141: (1, 2)
102: (2, 3) → 175: (2, 3)
103: (1, 3) → 164: (1, 3)
104: (1)    → 176: (1)
105: (3)    → 142: (3)
106: (2, 3) → 153: (2, 3)
```

141: (1, 2)
142: (3)
153: (2, 3)
164: (1, 3)
175: (2, 3)
176: (1)

101: (1, 2) → 141: (1, 2)
102: (2, 3) → 153: (2, 3)
103: (1, 3) → 165: (1, 3)
104: (1) → 158: (1)
105: (3) → 145: (3)
106: (2, 3) → 172: (2, 3)

141: (1, 2)
145: (3)
153: (2, 3)
158: (1)
165: (1, 3)
172: (2, 3)

PERMUTABLE SWITCHING NETWORK WITH ENHANCED MULTICASTING SIGNALS ROUTING FOR INTERCONNECTION FABRIC

RELATED APPLICATIONS

This is a continuation application of application Ser. No. 12/327,704, filed Dec. 3, 2008 now U.S. Pat. No. 7,714,611, which is hereby incorporated by reference. This application is related to U.S. patent application Ser. No. 12/327,702, filed Dec. 3, 2008, which is assigned to the same assignee as the current application.

TECHNICAL FIELD

Embodiments of this invention relate to switching networks used in an interconnection fabric and, in particular, can be used with programmable logic circuits.

BACKGROUND

A programmable logic circuit, also referred to as field programmable gate array (FPGA) is an off the shelf integrated logic circuit which can be programmed by the user to perform logic functions. Circuit designers define the desired logic functions and the circuit is programmed to process the signals accordingly. Depending on logic density requirements and production volumes, programmable logic circuits are superior alternatives in terms of cost and time to market. A typical programmable logic circuit is composed of logic cells where each of the logic cells can be programmed to perform logic functions on its input variables. Additionally, interconnect resources are provided throughout the programmable logic circuit which can be programmed to conduct signals from outputs of logic cells to inputs of logic cells according to user specification.

As technology progresses to allow for larger and more sophisticated programmable logic circuits, both the number of logic cells and the required interconnect resources increases in the circuit. Competing with the increased number of logic cells and interconnect resources is the need to keep the circuit size small. One way to minimize the required circuit size is to minimize the interconnect resources while maintaining a certain level of connectivity. Therefore, it can be seen that as the functionality implemented on the chip increases, the interconnection resources required to connect a large number of signals can be quickly exhausted. The tradeoffs are either to provide for a lower utilization of logic cells in a circuit while keeping the circuit size small or to provide more routing resources that can increase the circuit size dramatically.

There has been a progression of increasingly complex connection styles over the last forty years in the field of programmable logic circuits. L. M. Spandorfer in 1965 describes possible implementation of a programmable logic circuit using neighborhood interconnection, and connections through multiple conductors using switches in a Clos network. R. G. Shoup in his PhD thesis of 1970 describes both the use of a neighborhood interconnect and the use of a bus for longer distance interconnect.

Freeman in U.S. Pat. No. 4,870,302 of 1989 describes a commercial implementation of a FPGA using neighborhood interconnects, short (length one, called single) distance interconnects, and global lines for signals such as clocks. The short distance interconnects interact with the inputs and outputs of logic cells where each input is connected through switches to every short wire neighboring to a logic cell and horizontal and vertical short wires connect through a switch box in a junction. El Gamal et al. in U.S. Pat. No. 4,758,745 introduces segmented routing where inputs and outputs of logic cells interact with routing segments of different lengths in one dimension.

Peterson et al. in U.S. Pat. No. 5,260,610 and Cliff et al. in U.S. Pat. No. 5,260,611 introduce a local set of conductors interfacing with a set of logic elements where every input of the logic elements is connected, through switches, to every local conductor in the set; additional chip length conductors are introduced both horizontally and vertically where the horizontal conductor can connect to the vertical conductors and the horizontal conductors connect to multiple local conductors. In U.S. Pat. Nos. 4,870,302, 4,758,745, 5,260,610, and 5,260,611, the input conductor of a logic cell has full connections to the set of local conductors (e.g. for n-inputs and k-local conductors, there is n×k switches connecting the inputs to the local conductors. A multiplexer (MUX) scheme may also be used so that the number of transistors is reduced.). In U.S. Pat. No. 4,870,302, 4,758,745, 5,260,610, and 5,260,611, the general interconnect resources are limited to one or two different lengths (i.e. singles of U.S. Pat. No. 4,870,302, local and chip length in U.S. Pat. Nos. 5,260,610 and 5,260,611) or limited in one dimension (i.e. different lengths horizontally in U.S. Pat. No. 4,758,745, local vertically in U.S. Pat. Nos. 5,260,610 and 5,260,611).

Camarota et al. in U.S. Pat. No. 5,144,166 and Kean in U.S. Pat. No. 5,469,003 introduce a routing scheme with more than two different lengths in both dimensions with limitations in the reach of those conductors. While U.S. Pat. No. 5,144,166 allows each wire to be selectively driven by more than one possible driving source, U.S. Pat. No. 5,469,003 is limited to be unidirectional in that each wire is hardwired to a multiplexer output. The connectivity provided in both U.S. Pat. Nos. 5,144,166 and 5,469,003 are very low, based on the premises that either connections are neighborhood or relatively local, or logic cells itself can be used as interconnection resources instead of performing logic functions. Ting in U.S. Pat. Nos. 5,457,410, 6,507,217, 6,051,991 and 6,597,196 described a multiple level architecture where multiple lengths of conductors interconnect through switches in a hierarchy of logic cells.

Young et al. in U.S. 2001/0007428 and U.S. Pat. No. 5,914,616 describe an architecture with multiple lengths of wires in two dimensions (three in each dimension), where for short local connections, a near cross-bar scheme is used where a set of logic cells outputs are multiplexed to a reduced set of output ports which then interface to other interconnect resources. The longer wires generally fan-in into shorter length wires in a respective dimension. Reddy et al. in U.S. Pat. No. 6,417,694 discloses another architecture where inter-super-region, inter-region, and local conductors are used. A cross-bar scheme is used at the lowest level (using MUXs) for the local wires to have universal access to the inputs of the logic elements. Reddy et al. in U.S. Pat. No. 5,883,526 discloses various schemes having circuit reduction techniques in the local cross-bar.

Reblewski et al. in U.S. Pat. No. 6,594,810 describes an architecture building a programmable logic circuit using crossbar devices recursively. Wong in U.S. Pat. Nos. 6,693,456 and 6,940,308 use Benes switching networks as the interconnection fabric for programmable logic circuit.

At the base level of circuit hierarchy, multiple-input Look Up Table (LUT) logic cells are commonly used. There are two advantages in using a LUT as the base logic cell. One advantage is that the LUT allows programmable implementation of any Boolean functions having up to the multiple-input and one output. Another advantage is that the multiple inputs are interchangeable and logically equivalent. Hence, it does not matter which signal connecting to which input pin of the LUT for the LUT to function correctly as long as those signals connect to the respective inputs of the LUT.

A common problem to be solved in any programmable logic circuit is that of interconnectivity, namely, how to connect a first set of conductors or pins carrying signals to a second multiple sets of conductors to receive those signals where the logic cells originating the signals and the logic cells receiving the signals are spread over a wide area in an integrated circuit (i.e., M number of outputs from M or less number of logic cells where one or more outputs of each logic cells connects to inputs of one or more logic cells). A conventional solution is to use a cross bar switch where every conductor of the first set is connectable to every conductor in the second multiple sets of conductors directly through a switch. Unfortunately, this approach is impractical in most cases. Prior solutions in one degree or another try to divide the connectivity problem into multiple pieces using a divide and conquer strategy where local clusters of logic cells are interconnected and extended to other clusters of logic, either through extensions of local connections or using longer distance connections. These prior interconnect schemes are ad hoc and mostly based on empirical experiences. A desired routing model or interconnect architecture should enable or guarantee full connectivity for a large number of inputs and outputs over a large part of the circuit all the time.

U.S. Pat. Nos. 6,975,139, 7,256,614 and 7,417,457 by the present inventors describe one type of switching network (L-SN) with L levels of intermediate conductors which uses $\Sigma_{i=[1:L+1]}(I[i-1]\times D[i])$ number of switches and L levels of intermediate conductors of I[i] number of conductors, having D[i] sets of conductors for i=[1:L] to connect a 0-th level of conductors of I[0] number of conductors to a (L+1)-th level of conductors of $(D[L+1]\times \Pi_{j=[1:L]}D[j])$ number of conductors consisting of D[L+1] sets of conductors. The L-SN can be used as part of an interconnection fabric for a switching system, a router or a programmable logic circuit with much reduced switch counts and the number of switches used in the switching network is determined by a mathematical relations of the sizes of the 0-th level of conductors of I[0] number of conductors, the L levels of intermediate conductors and the size of the (L+1)-th level of conductors of $(D[L+1]\times \Pi_{i=[1:L]}D[i])$ number of conductors consisting of D[L+1] sets of conductors. The switching network, when limited to be a 1-SN or at the last intermediate stage or level in the conventional designs, can have certain routing limits when at least one multicasting signal is logically grouped together with other signals from the first set of conductors in a skewed distribution. Thus, it is desirable to have an enhanced permutable switching network for programmable logic circuits where the mutability or interconnectivity may be enhanced in the presence of multicasting signals independent of signal distribution while the cost of interconnections remains low in terms of number of switches and the software efforts in determining a place and route and the circuit layout implementation may be simplified.

One type of an L-level switching network (L-SN) of the conventional design was first described by the present inventors in U.S. Pat. Nos. 6,975,139, 7,256,614 and 7,417,457 in which the L-SN has (L+2) levels of conductors with L-level(s) of intermediate conductors of I[i] number of conductors consisting of D[i] sets of conductors for i=[1:L], L≧1 and $\Sigma_{i=[1:L+1]}(I[i-1]\times D[i])$ number of switches where the 0-th level of pins or conductors of I[0] number of pins or conductors selectively couple to the (L+1)-th level of pins or conductors of $(D[L+1]\times \Pi_{j=[1:L]}D[j])$ number of pins or conductors consisting of D[L+1] sets of pins or conductors through the L level(s) of intermediate conductors and $\Sigma_{i=[1:L+1]}(I[i-1]\times D[i])$ number of switches of the L-SN. A variable, $D_S[i]$, is defined as $D_S[i]=(I[i-1]/I[i])\times D[i]$ for i=[1:L+1]. A $D_S[i]$ tuple is $D_S[i]$ number of conductors of the (i−1)-th level of conductors with the characteristics that the $D_S[i]$-tuple selectively couple to one conductor, through a respective $D_S[i]$ number of switches, in each of the D[i] sets of conductors of the i-th level of conductors of the L-SN for i=[1:L+1]. Additionally, in the L-SN, the I[i−1] number of conductors of the (i−1)-th level can be organized into $(I[i-1]/D_S[i])$ groups of $D_S[i]$-tuples for i=[1:L+1].

As an illustration of the conventional designs, FIG. 1A shows one embodiment of the switch couplings between the first two levels of conductors in the conventional L-SN of U.S. Pat. Nos. 6,975,139, 7,256,614 and 7,417,457, where L=2: the 0-th level of conductors of I[0]=36 number of conductors, [1:36], selectively couple to the first level of conductors of I[1]=36 number of conductors consisting of D[1]=2 sets of (intermediate) conductors, {[101:118], [119:136]}; not every conductor of I[1] number of conductors are labeled in the embodiment of FIG. 1A, and for purpose of illustration, those conductors are assumed to be consecutively labeled, thus the first set of conductors of the D[1]=2 sets has (I[1]/D[1])=18 conductors, [101:118], where the I[0] number of conductors [1:36] selectively couple to the eighteen conductors [101:118] of the first set of the first level of conductors through I[0]=36 number of switches; and the D[1]-th set has eighteen conductors [119:136] where the I[0] number of conductors [1:36] selectively couple to the eighteen conductors [119:136] of the D[1]-th set of the first level of conductors through I[0]=36 number of switches. A $D_S[1]$-tuple of the embodiment of FIG. 1A is of size two which is any of the two consecutive conductors such as [1,2], [3,4], etc. of the I[0] number of conductors [1:36]; a $D_S[2]$-tuple is of size three which is any of the three consecutive conductors such as [101:103], [104:106], etc. of the I[1] number of conductors [101:136].

FIG. 1B illustrates one embodiment of the switch couplings between the next two levels of conductors of the 2-SN embodiment of FIG. 1A; the first level of conductors of I[1] number of conductors selectively couple to each of the D[2]=3 sets of conductors of I[2]=36 number of conductors where each of the D[2] sets has twelve conductors: [141:152], [153:164] and [165:176]. Again, not every conductors of I[2] of FIG. 1B are labeled and they are assumed to be consecutively labeled; thus the I[1] number of conductors [101:136] selectively couple to each of the D[2] sets of twelve conductors: [141:152], [153:164] and [165:176] through, respectively, I[1]=36 number of switches. Since L=2, D[3]=D[L+1]=$\Pi_{j=[1:L]}D[j]$=6 and $D_S[3]=(I[2]/I[3])\times D[3]$=6, each of the six consecutively labeled conductors of I[2] of FIG. 1B such as [141:146], [147:152], etc. would be a $D_S[3]$-tuple.

FIG. 1C illustrates one embodiment of the switch couplings between the last two levels of conductors of the 2-SN embodiment of FIG. 1A and FIG. 1B; the second level of conductors of I[2] number of conductors selectively couple to each of the D[3]=6 sets of conductors of I[3]=36 number of conductors where each of the D[3] sets has six conductors: [181:186], [187:192], [193:198], [199:204], [205:210] and [211:216]. Again, not every conductors of I[3] of FIG. 1C are labeled and they are assumed to be consecutively labeled; thus the I[2] number of conductors [141:176] selectively couple to each of the D[3] sets of six conductors: [181:186],

[187:192], [193:198], [199:204], [205:210] and [211:216] through, respectively, I[2]=36 number of switches.

It is readily observed that any of the conventional L-SN described above can be drawn such that the $D_S[i]$ number of conductors of each $D_S[i]$-tuple can be logically labeled as being consecutive for i=[1:L+1] as illustrated in FIG. 1A through FIG. 1C.

In the embodiment of FIG. 1B, assuming conductor or net 101 carries signal connection specification (1, 2) indicating destination connection specifications to F1 and F2 modules of FIG. 1C of the L-SN, net 102 has connection specifications of (2, 3), net 103 has connection specifications of (1, 3), net 104 has connection specifications of (1), net 105 has connection specifications of (3) and net 106 has connection specifications of (2, 3); the six nets [101:106], or the two $D_S[i]$-tuples {[101:103], [104:106]}, has a total of ten connections to the pins of the [F1:FK] modules with three connections to F1, three connections to F2 and four connections to F3. At most nine connections can be made in the 2-SN example of FIG. 1B and FIG. 1C, illustrated by the blackened squares indicating activating the switches connecting the conductors where one of the connection specifications (3), connecting to a pin of F3, of net 106 can not be made in the six nets example illustrated in FIG. 1B and FIG. 1C.

Specifically, in FIG. 1B and FIG. 1C, net 101 connects to 141 which then connects to 181 of F1 and 187 of F2 through the respective switches indicated by the blackened squares, net 102 connects to 153 which then connects to 189 of F2 and 195 of F3 through the respective switches indicated by the blackened squares, net 103 connects to 165 which then connects to 185 of F1 and 197 of F3 through the respective switches indicated by the blackened squares, net 104 connects to 154 which then connects to 183 of F1 through the respective switches indicated by the blackened squares, net 105 connects to 142 which then connects to 193 of F3 through the respective switches indicated by the blackened squares, net 106 connects to 166 which then connects to 191 of F2 through the respective switches indicated by the blackened squares while the connection to F3 of net 106 can not be completed.

Thus generally the six conductors [101:106] of the (i−1)-th level of conductors can be considered as "source-conductors" or the two $D_S[i]$-tuples {[101:103], [104:106]} can be considered as "source-tuples" where the "source-conductors" or the "source-tuples" selectively couple to six conductors of the i-th level of conductors (141, 142, 153, 154, 165, 166) where those conductors can be considered as the "coupling-conductors" for i=2 in FIG. 1B.

The six nets routing example illustrated using FIG. 1B and FIG. 1C with one pin connection left un-routed can be resolved if the connection specifications are not congested together: this can either be accomplished by changing the switch coupling patterns between two consecutive levels of conductors different from the L-SN constructs or by managing the distributions upstream to prevent locally skewed congestions downstream.

BRIEF DESCRIPTION OF THE DRAWINGS

The objectives, features, and advantages of the present invention will be apparent from the following detailed description in which.

DETAILED DESCRIPTION

Figure 1A:
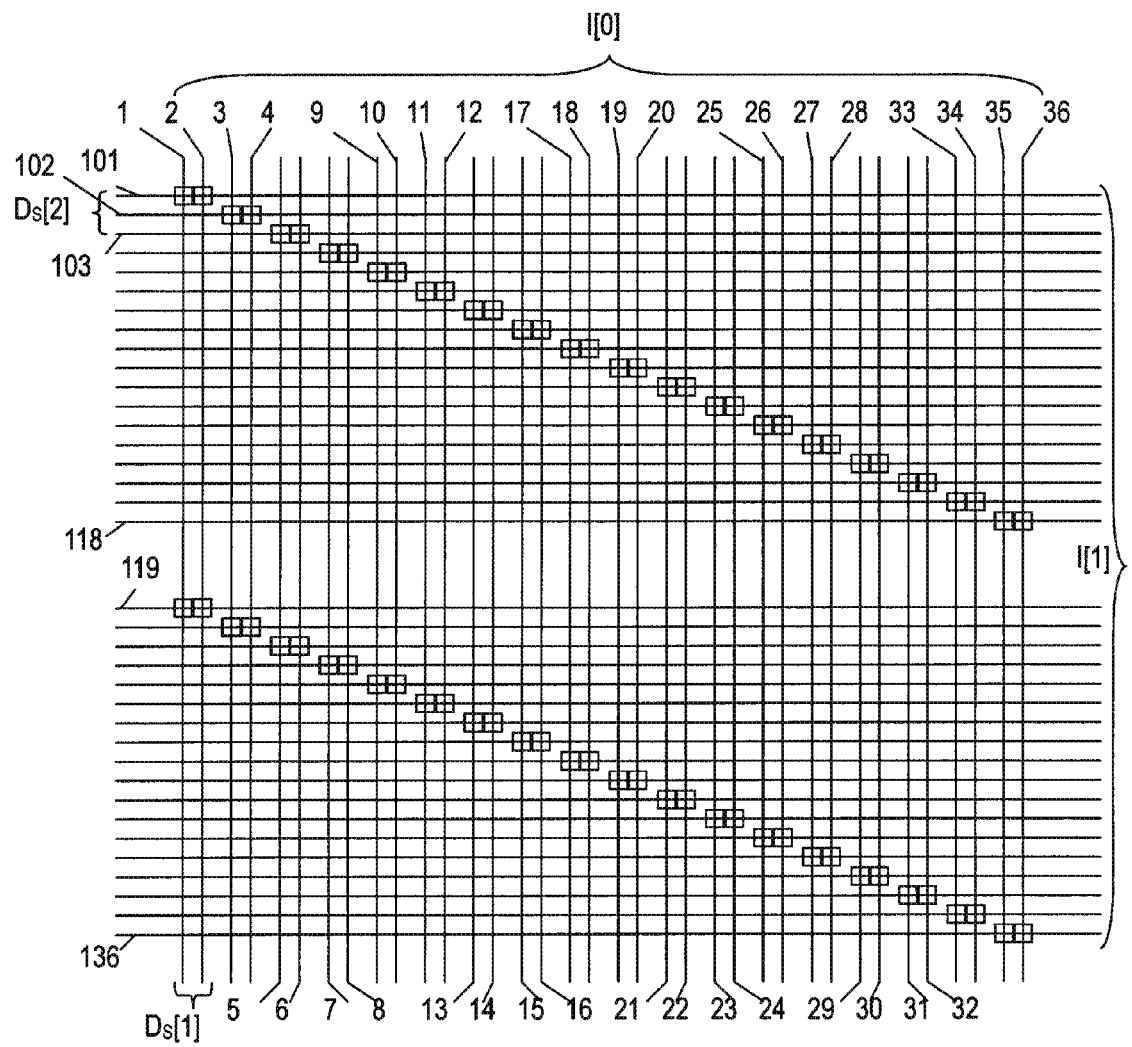
FIG. 1A illustrates a conventional embodiment of the 0-th level and the first level of conductors of a two-stages switching network (2-SN) with I[0]=36, D[1]=$D_S$[1]=2 and (I[0]×D[1])=72 switches.

A new L-level(s) permutable switching network (L-PSN) which uses $\Pi_{j=[1:L+1]}(I[j-1]\times D[j])$ number of switches and L-level(s) of intermediate conductors of I[i] number of conductors having D[i] sets of conductors for i=[1:L] to connect the 0-th level of pins or conductors of I[0] number of pins or conductors to the (L+1)-th level of pins or conductors of $(D[L+1]\times\Pi_{j=[1:L]}D[j])$ number of pins or conductors having D[L+1] sets of pins or conductors through the L level(s) of intermediate conductors and $\Sigma_{j=[1:L+1]}(I[j-1]\times D[j])$ number of switches of the L-PSN with different switch coupling schemes from the conventional L-SN are described in this application for L>1. An L-PSN of this application has the same definition of $D_S[i]$-tuple and the coupling characteristics of the $D_S[i]$-tuples as those in the conventional L-SN discussed above. Another patent application by the present inventors, U.S. patent application Ser. No. 12/327,702, disclosed an alternative L-PSN with different switch coupling schemes operating on conductors between two consecutive levels of conductors.

The L-PSN of this application can be applied to a wide range of applications, when used, either as a 1-PSN, or used hierarchically in multiple stages, as a L-PSN, to provide a large switch network that can be used in switching, routers, and programmable logic circuits. The permutable switching network in this present invention provides enhanced connectivity or routability over the conventional design, including the handling multicasting signals.

In the following descriptions, for purposes of explanation, numerous specific details are set forth in order to provide a thorough understanding of the present invention. It will be apparent to one skilled in the art that embodiments of the present invention may be practiced without these specific details. In other instances, well-known structures and circuits are shown in block diagram form in order to avoid unnecessarily obscuring the present invention. For purpose of description, unless otherwise specified, the terms program controlled switch and switch are interchangeable in the context of this description; the terms program configured logic cell, logic cell, cell, Look Up Table (LUT), programmable logic cell are interchangeable in the context of this description; the terms conductor, pin, line are interchangeable in the context of this description; signal, net, signal net are interchangeable in the context of this description which generally refers to a conductor carrying signal from a source to destination(s); while port and conductors or a set of conductors are interchangeable in the context of this description where a port has a set of pins or conductors. Thus a net associated with a conductor of a 0-th level of I[0] number of conductors or pins generally carries a signal which is to be selectively connected, through a permutable switching network (L-PSN), to one or more conductors or pins, each of which is selected from one of the (L+1)-th level of conductors $(D[L+1]\times\Pi_{i=[1:L]}D[i])$ number of conductors consisting of D[L+1] sets of conductors through L-level(s) of intermediate conductors of I[i] number of conductors having D[i] sets of conductors for i=[1:L]. Thus it should be clear, for one skilled in the art, that the terms conductor, pin, line, signal, net are interchangeable depending on the context of this description. The notations [ ] and ( ) sometimes are used interchangeably to indicate one or more objects such as conductors or pins being grouped together. It should also be noted that the present invention describes embodiments which use program control means to set the states of switches utilized, this control means can be one time, such as fuse/anti-fuse technologies, or re-programmable, such as SRAM (which is volatile), FLASH (which is non-volatile), Ferro-electric (which is non-volatile), etc. Hence the present invention pertains to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferro-electric processes.

When a program controlled switch is used to interconnect one conductor to another conductor, a driver circuit may be coupled to the switch to improve the speed of the signal traversing those conductors; thus a switch can be comprised of a driver circuit. Additionally, if multiple conductors (signals) fan-in to a conductor through program controlled switches, it is possible to use a MUX scheme, if desired, to either reduce loading on the conductor or to reduce circuit size, or both, depending on the process technology used. In the case where a MUX is used, the multiple switches are converted into a new switching mechanism where, the number of control states are the same as the number of switches; connectivity is enabled by choosing the particular state (corresponding to the switch when multiple switches were used) in connecting two conductors and the states are determined by program control; as an example, in a four to one MUX there are four states to control the selection of which one of the four inputs is connected to the one output hence each state corresponds to a respective switch which can be program controlled.

In this application, various alternative schemes of switch couplings operating on $D_S[i]$-tuples between the (i−1)-th level of conductors and the i-th level of conductors are described to enhance connectivity or routing in the presence of multicasting signals. In the many L-PSN illustrations in this application, a $D_S[i]$-tuple will be mostly drawn as having consecutively labeled numbers. Due to the nature of combinatorics, operating in sets, e.g., $D_S[i]$-tuples, instead of individual conductors, e.g. $D_S[i]$ number of conductors, can greatly simplify the problem size and reduce software complexity.

The new L-PSN has the following formulations:

PSN-(A): Each conductor of the I[i−1] number of conductors of the (i−1)-th level of conductors selectively couples to one conductor in each of the D[i] sets of conductors of the i-th level of conductors of I[i] number of conductors through a switch with a total of D[i] number of switches for i=[1:L+1].

PSN-(B): The I[i−1] number of conductors of the (i−1)-th level of conductors selectively couple to the conductors of each D[i] sets of conductors of the i-th level of conductors through I[i−1] number of switches with a total of (I[i−1]×D[i]) number of switches coupling between the two levels of conductors for i=[1:L+1].

PSN-(C): Each $D_S[j]$-tuple of $(I[j-1]/D_S[j])$ groups of $D_S[j]$-tuples of the I[j−1] number of conductors of the (j−1)-th level of conductors selectively couple to one conductor, through a respective $D_S[j]$ number of switches, in each of the $D[j]$ sets of conductors of the j-th level of conductors for an j selected from j=[1:L].

PSN-(D): Any $D_S[j+1]$ groups of $D_S[j]$-tuples of $(T \times D_S[j+1])$ groups of $D_S[j]$-tuples of the (j–1)-th level of conductors of $I[j–1]$ number of conductors selectively couple to $D_S[j+1]$ number of conductors in each of the $D[j]$ sets of conductors having respectively T groups of $D_S[j+1]$-tuples of the j-th level of conductors of $I[j]$ number of conductors through $(D_S[j+1] \times D_S[j] \times D[j])$ number of switches and the $D_S[j+1]$ groups of $D_S[j]$-tuples selectively couple to the conductors of at least two $D_S[j+1]$-tuples of at least one of the $D[i]$ sets of conductors having respectively T groups of $D_S[j+1]$-tuples of the j-th level of conductors, through a respective $(D_S[j+1] \times D_S[j])$ number of switches of the $(D_S[j+1] \times D_S[j] \times D[j])$ number of switches, for L>1 and T>1.

An L-PSN can have either localized switch couplings between two consecutive level of conductors as specified by PSN-(D) for at least one j selected from j=[1:L] when T is less than $(I[j–1]/D_S[j]/D_S[j+1])$ or has global switch couplings between the two consecutive level of conductors when $T=(I[j+1]/D_S[j]/D_S[j+1])$ in the PSN-(D) formulations.

The PSN-(A) and PSN-(B) formulations of this application are the same as the PSN-(A) and PSN-(B) formulations of the other related application by the present inventors, U.S. patent application Ser. No. 12/327,702 with different PSN-(C) and PSN-(D) formulations. There are abroad arrays of L-PSNs which can be constructed based on the PSN-(A) through PSN-(D) formulations above. The conventional L-SN can be constructed as localized switch couplings case using the PSN-(A) through PSN-(C) formulations without the PSN-(D) formulations for L>1. For L=1, where PSN-(D) formulations would not be applicable, a 1-PSN is the same as the conventional 1-SN.

Figure 2A:
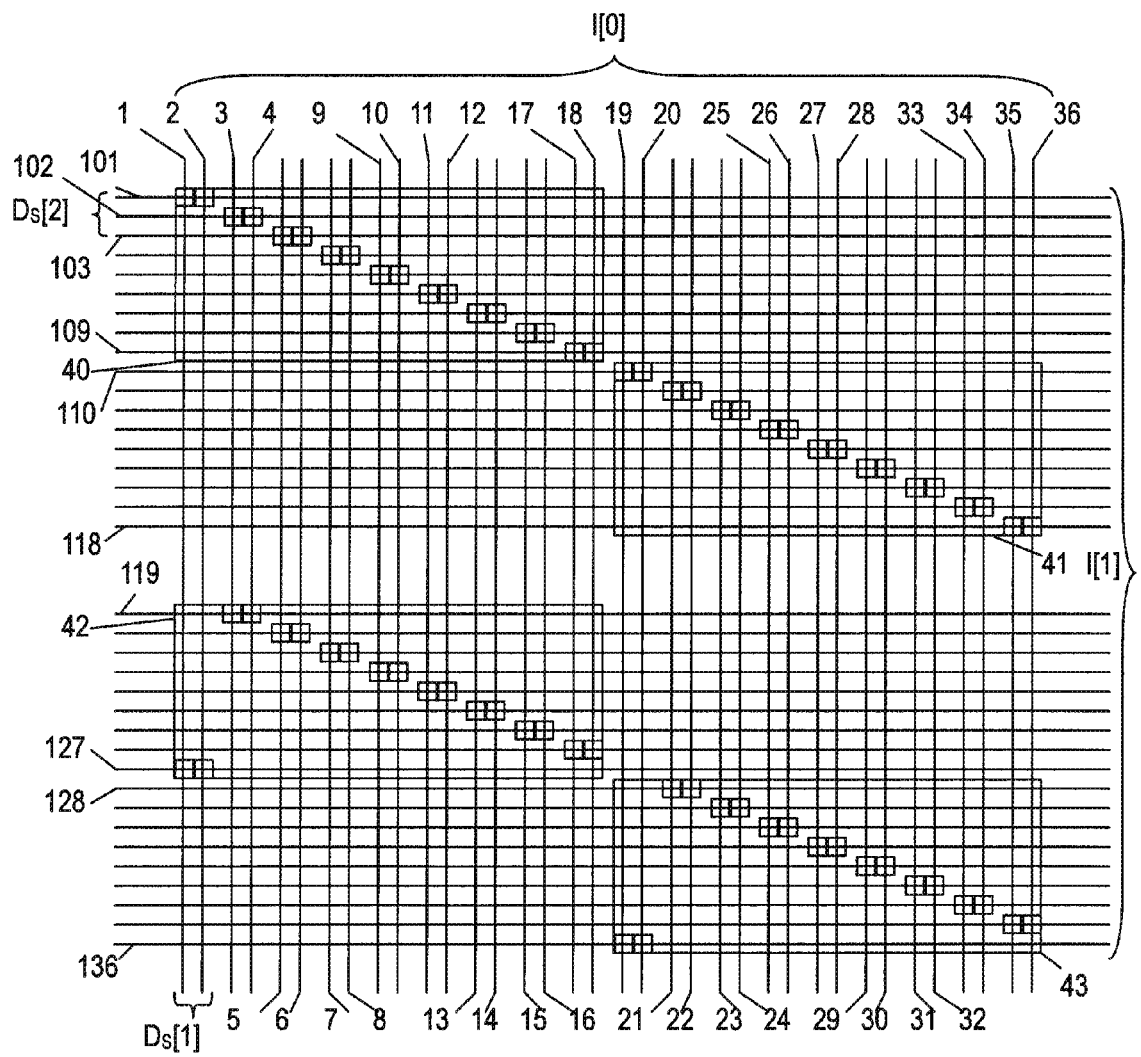
FIG. 2A illustrates one embodiment of a L-PSN with L=2 of the 0-th level and the first level of conductors of a two-stages permutable switching network (2-PSN) having one circular (barrel) shift of $D_S$[1]-tuples of a localized switch coupling patterns between the 0-th level of conductors of I[0] number of conductors and the first level of conductors of I[1] number of conductors having D[1] sets of intermediate conductors with I[0]=36, D[1]=$D_S$[1]=2 and (I[0]×D[1])=72 switches.
Figure 2B:
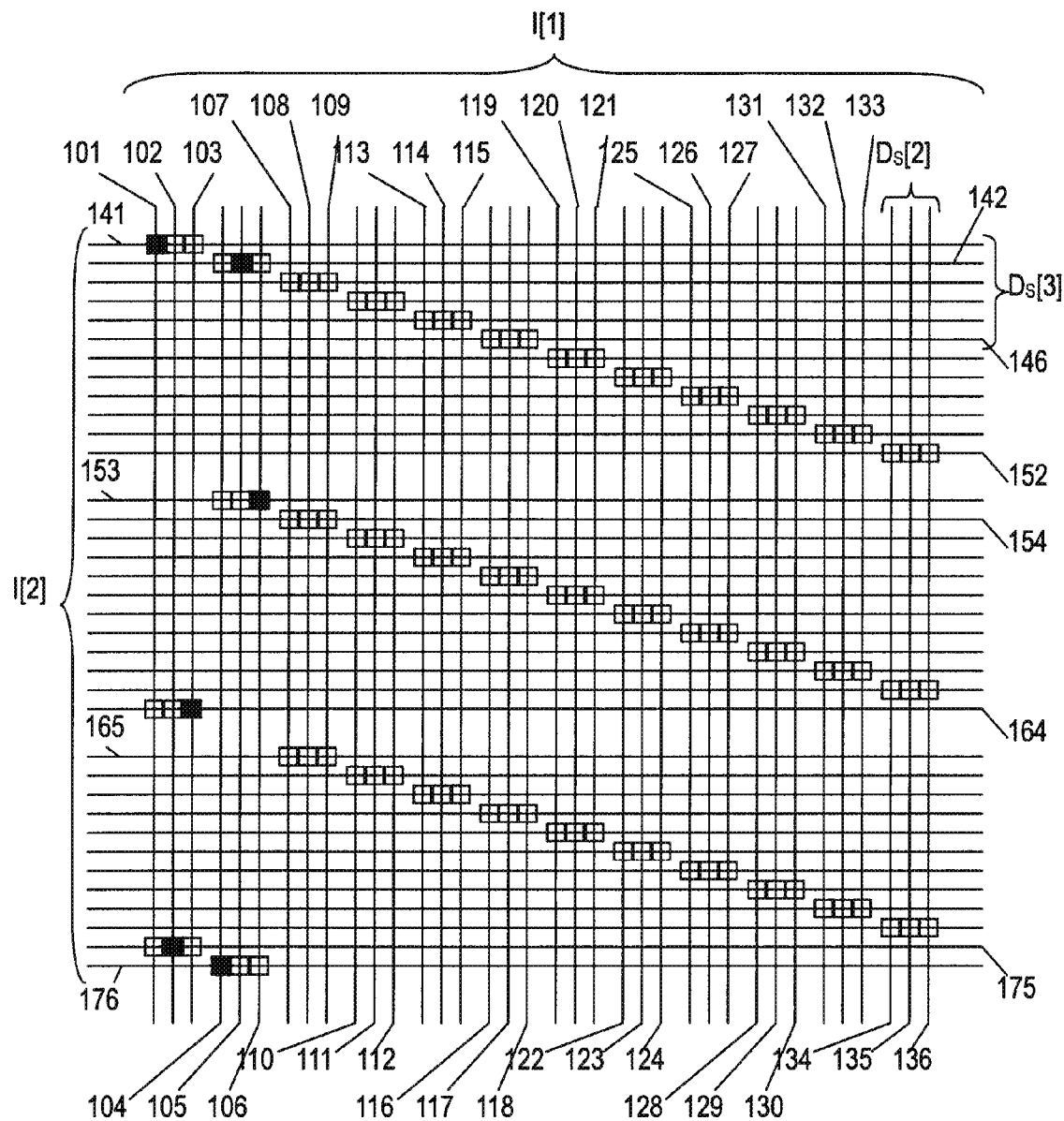
FIG. 2B illustrates one embodiment of a L-PSN with L=2 of the first level and the second level of conductors of a two-stages permutable switching network (2-PSN) having (D[i]−1) sets of circular (barrel) shifts of $D_S$[2]-tuples of a global level switch coupling patterns between the first level of conductors of I[1] number of conductors and the second level of conductors of I[2] number of conductors consisting of D[2] sets of intermediate conductors with I[1]=36, D[2]=$D_S$[2]=3 and (I[1]×D[2])=108 switches.
Figure 2C:
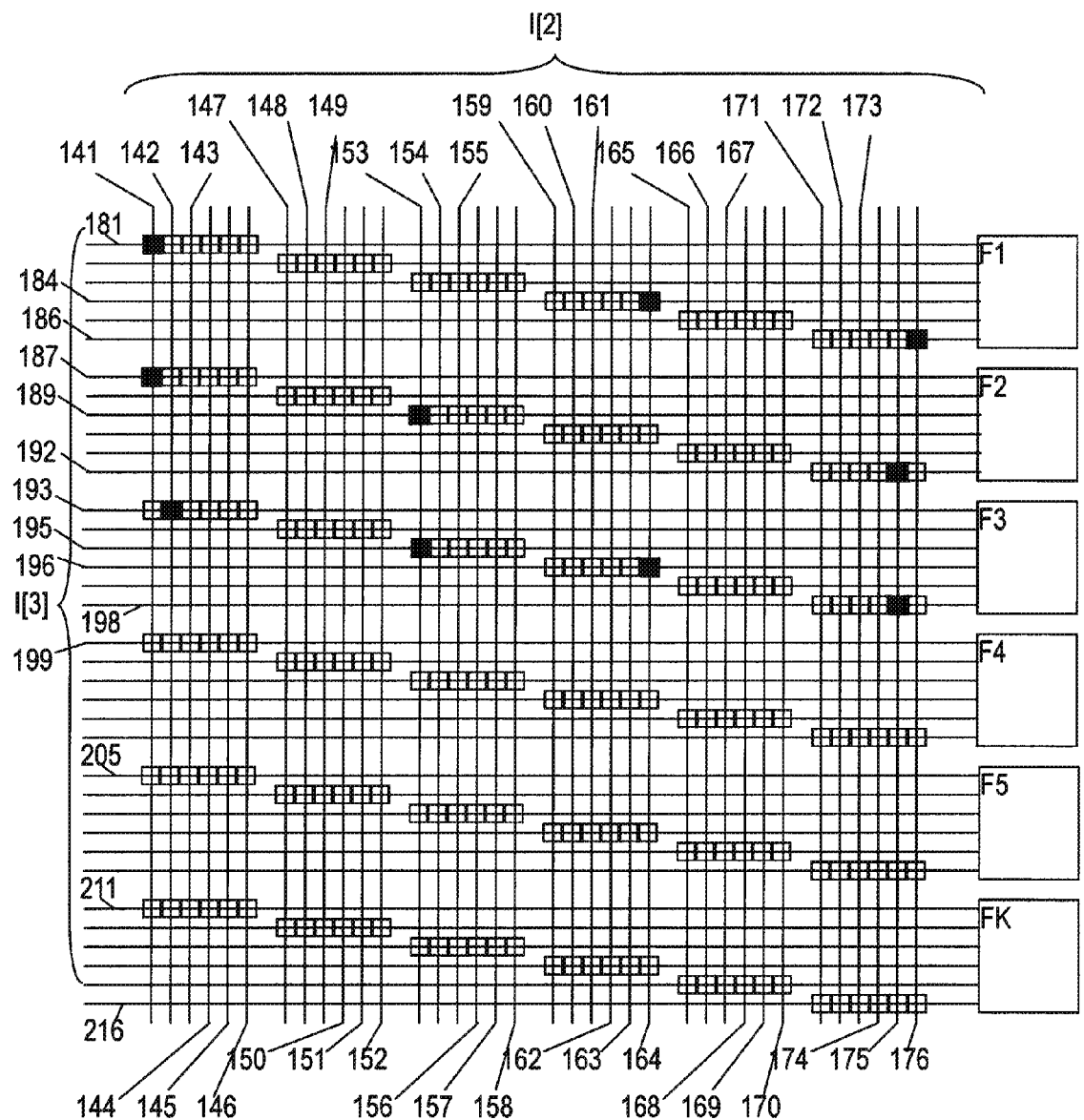
FIG. 2C illustrates one embodiment of a L-PSN with L=2 of the second level and the third level of conductors of a two-stages permutable switching network (2-PSN) having the same switch coupling patterns of the conventional embodiment of FIG. 1C with I[2]=36, D[3]=6 and (I[2]×D[3])=216 switches.

By way of illustrations of the new L-PSN, in accordance to the PSN-(A) through PSN-(D) formulations, one of the simplest L-PSN with L=2 is illustrated in the embodiments of FIG. 2A through FIG. 2C. Not every conductor in the respective illustrations of the embodiments of FIG. 2A through FIG. 2C are labeled, those conductors are assumed to be consecutively numbered and thus labeled. The switch coupling patterns in the embodiment of FIG. 2A illustrating the case i=1 of the L-PSN where the switch couplings between I[0]=[1:36] and the first of the D[1] sets of conductors [101:118] are the same as those in the embodiment of FIG. 1A; the switch couplings between I[0]=[1:36] and the D[1]-th set of conductors [119:136] are constructed by circularly shifting the switch coupling patterns, respectively, of the first $(T \times D_S[1])=(3 \times 3)=9$ number of $D_S[1]$-tuples (of size two){[1, 2], [3,4], [5,6], [7,8], [9,10], [11,12], [13,14], [15,16], [17, 18]} of the I[0] number of conductors [1:36] which are selectively coupled to conductors [119:127] of the D[1]-th set of conductors of I[1] number of conductors [101:136] and the second $(T \times D_S[1])=(3 \times 3)=9$ number of $D_S[1]$-tuples {[19,20], [21,22], [23,24], [25,26], [27,28], [29,30], [31,32], [33,34], [35,36]} of the I[0] number of conductors [1:36] which are selectively coupled to the conductors [128:136] of the D[1]-th set of conductors of I[1] number of conductors [101:136], by one to the right as indicated by the switch coupling patterns of 42 with respect to the switch coupling patterns of 40 and the switch coupling patterns of 43 with respect to the switch coupling patterns of 41. The embodiment of FIG. 2A represents a localized switch coupling patterns for i=1 where T is less than $(I[i–1]/D_S[i]/D_S[i+1])$ in the PSN-(D) formulations.

The embodiment of FIG. 2B illustrates the case where i=L=2 in the L-PSN where the switch coupling patterns is similar to those of FIG. 2A, except with a global level switch coupling patterns where $T=(I[i–1]/D_S[i]/D_S[i+1])$ in the PSN-(D) formulations. The switch coupling patterns between the 12 $D_S[2]$-tuples {[101:103], [104:106], [107:109], [110: 112], [113:115], [116:118], [119:121], [122:124], [125:127], [128:130], [131:133], [134:136]} of the I[1] number of conductors [101:136] and the conductors [153:164] which are conductors of the second D[2] sets of conductors of the I[2] number of conductors [141:176] are circularly shifted to the right by one with respect to the switch coupling patterns between the 12 $D_S[2]$-tuples of the I[1] number of conductors [101:136] and the conductors [141:152] which are conductors of the first D[2] sets of conductors of the I[2] number of conductors [141:176] while the switch coupling patterns between the 12 $D_S[2]$-tuples of the I[1] number of conductors [101:136] and the conductors [165:176] which are conductors of the D[2]-th set of conductors of the I[2] number of conductors [141:176] are further shifted to the right by one compared to those of the second D[2] sets of conductors of the I[2] number of conductors.

Figure 1B:
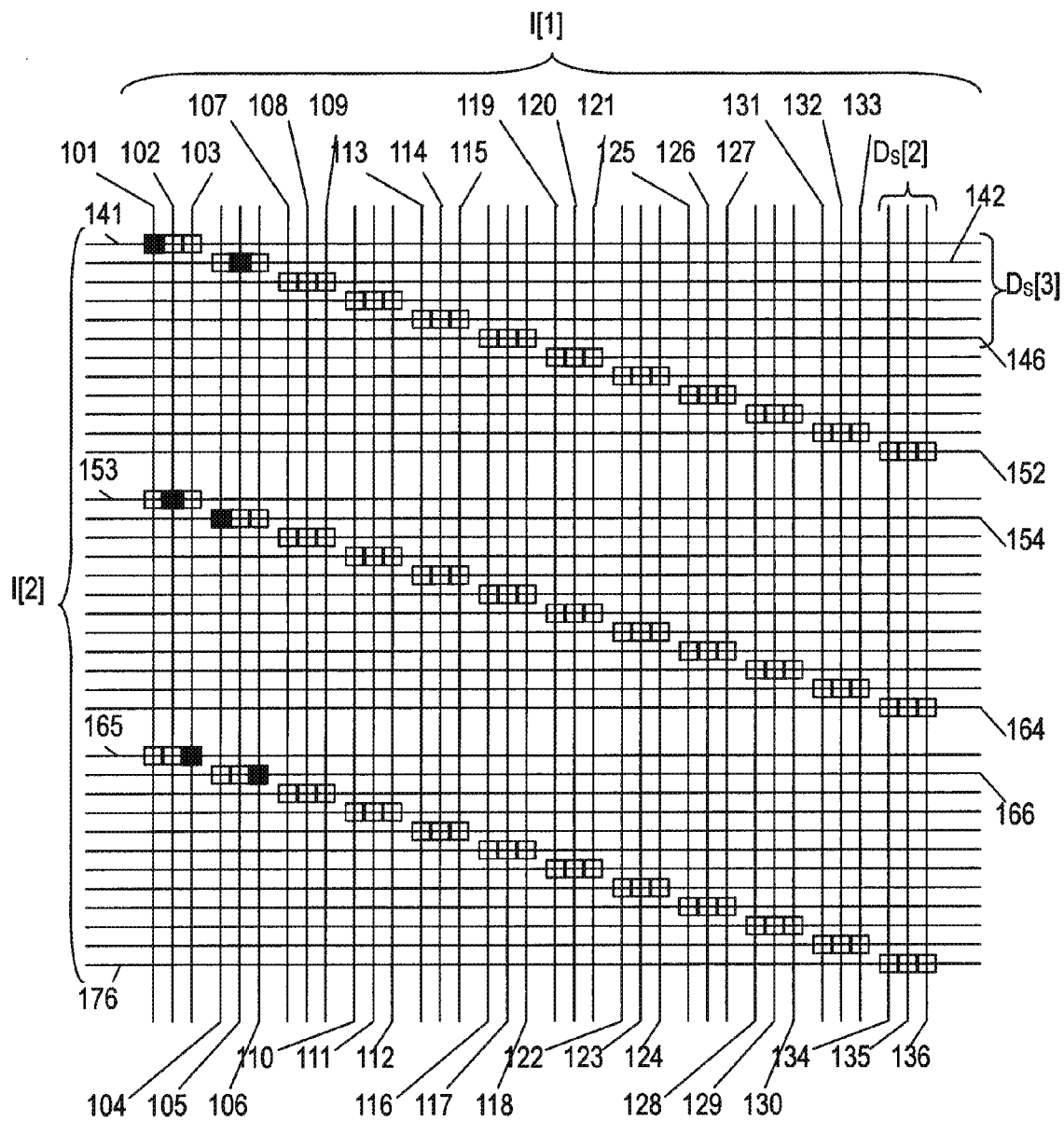
FIG. 1B illustrates a conventional embodiment of the first level and the second levels of conductors of a two-stages switching network (2-SN) with I[1]=36, D[2]=$D_S$[2]=3 and (I[1]×D[2])=108 switches.
Figure 1C:
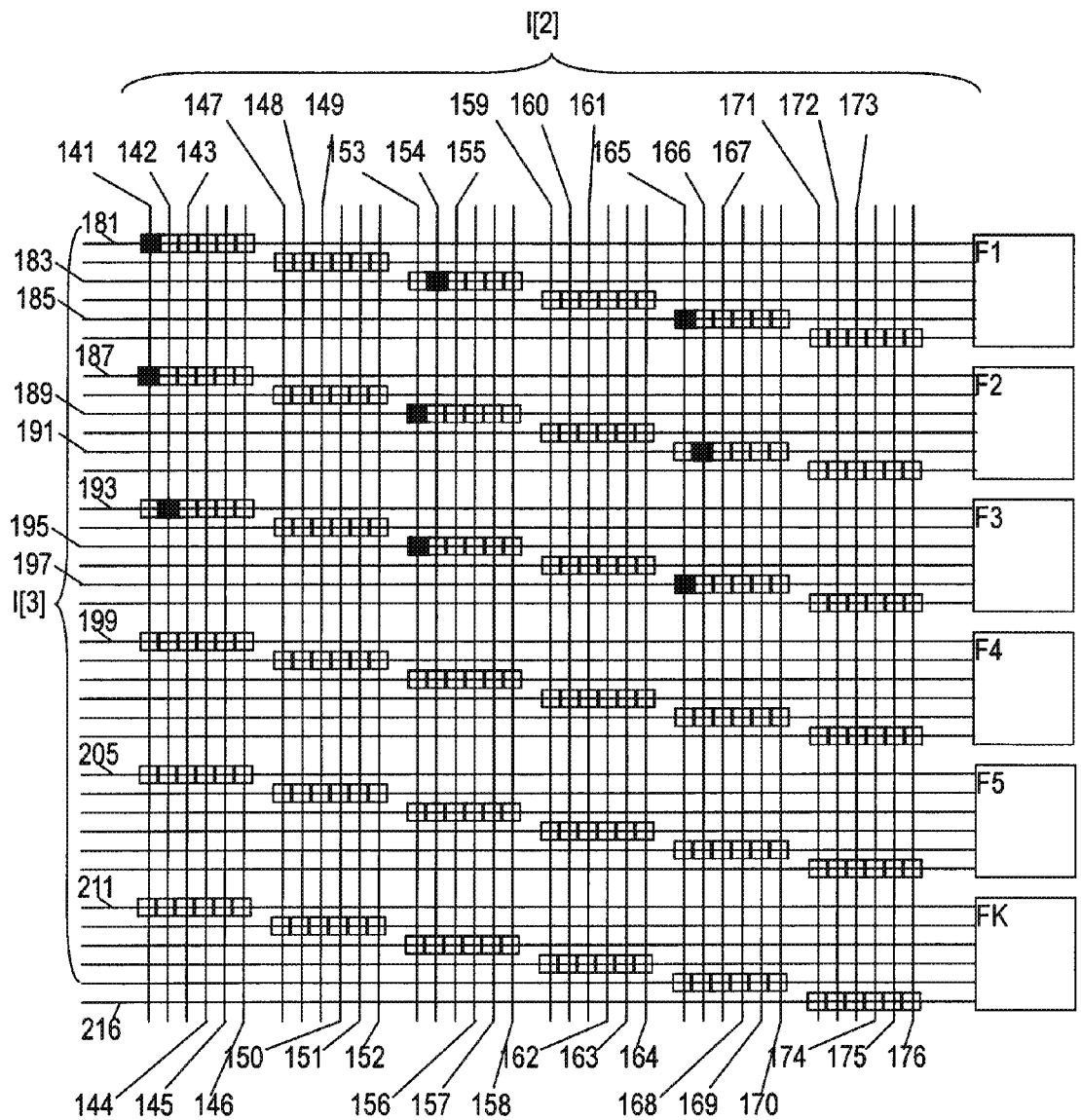
FIG. 1C illustrates a conventional embodiment of the second level and the third levels of conductors of a two-stages switching network (2-SN) with I[2]=36, D[3]=6 and (I[2]×D[3])=216 switches.

The embodiment of FIG. 2C illustrates the case where i=L+1=3 in the L-PSN, where the switch coupling patterns is the same as the conventional example of FIG. 1C.

Using the same six nets example illustrated above, where one of the connection specifications can not be completed using the conventional 2-PSN of FIG. 1B through FIG. 1C, in the embodiment of FIG. 2B, where 101 thus has the connection specifications (1, 2), 102 has the connection specifications of (2, 3), 103 has the connection specifications of (1, 3), 104 has the connection specifications of (1), 105 has the connection specifications of (3) and 106 has the connection specifications of (2, 3). By connecting 101 to 141, connecting 102 to 175, connecting 103 to 164, connecting 104 to 176, connecting 105 to 142, connecting 106 to 153 through the respective six switches indicated by the black squares of FIG. 2B, those six nets with ten pin connections can be completed in FIG. 2C by connecting 141 to 181 and 187, connecting 142 to 193, connecting 153 to 189 and 195, connecting 164 to 184 and 196, connecting 175 to 192 and 198 and connecting 176 to 186, thus completing a total of ten specified connections.

The L-PSN embodiment of FIG. 2A for i=1 has the properties that any $D_S[i+1]$ groups of $D_S[i]$-tuples of the (i–1)-th level of conductors selectively couple to conductors of at least (D[i]+1) groups of $D_S[i+1]$-tuples of the i-th level of conductors. The L-PSN embodiment of FIG. 2B for i=2 has the properties that any $D_S[i+1]$ groups of $D_S[i]$-tuples of the (i–1)-th level of conductors selectively couple to conductors of at least (D[i]+D[i]–1) groups of $D_S[i+1]$-tuples of the i-th level of conductors. In the case of conventional L-SN, any $D_S[i+1]$ groups of $D_S[i]$-tuples of the (i–1)-th level of conductors selectively couple to conductors of D[i] groups of $D_S[i+1]$-tuples of the i-th level of conductors.

Thus, in a L-PSN following the PSN-(A) through PSN-(D) formulations, based on the embodiments illustrated in FIG. 2A and FIG. 2B, there are two respective properties or characteristics:

PSN-(1): Any $D_S[i+1]$ groups of $D_S[i]$-tuples of $(T \times D_S[i+1])$ groups of $D_S[i]$-tuples of the (i–1)-th level of conductors of $I[i–1]$ number of conductors selectively couple to at least (D[i]+1) groups of $D_S[i+1]$-tuples of the D[i] sets respectively having T groups of $D_S[i+1]$-tuples of the i-th level of conductors for at least one i selected from i=[1:L+1] for T>1.

PSN-(2): Any $D_S[i+1]$ groups of $D_S[i]$-tuples of $(T \times D_S[i+1])$ groups of $D_S[i]$-tuples of the (i–1)-th level of conductors of $I[i–1]$ number of conductors selectively couple to at least $(D[i]+D[i]–1)=(2D[i]–1)$ groups of $D_S[i+1]$-tuples of the D[i] sets respectively having T groups of $D_S[i+1]$-tuples of the i-th level of conductors for at least one i selected from i=[1:L+1] for T>1.

When T=(I[i−1]/$D_S$[i]/$D_S$[i+1]), then the above PSN-(1) and PSN-(2) properties has the global level switch coupling patterns described in FIG. 2B and otherwise for T less than (I[i−1]/$D_S$[i]/$D_S$[i+1]), the switch coupling would be localized as described in FIG. 2A; and in the case where T=1 where PSN-(D) formulations does not apply, the switch coupling patterns between two consecutive levels of conductors would be the same as the conventional L-SN.

Figure 3A:
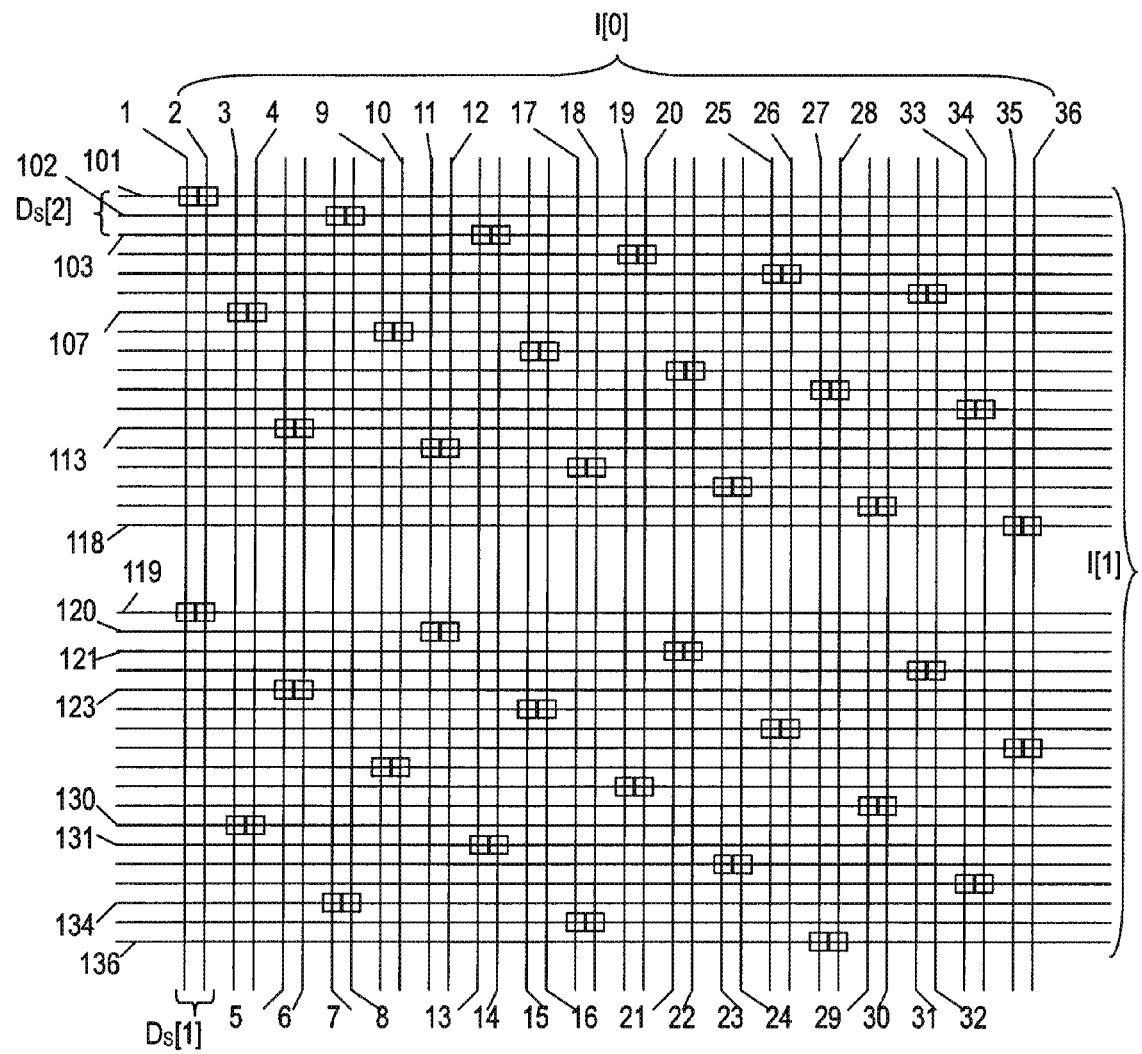
FIG. 3A illustrates an alternative embodiment of a L-PSN with L=2 of the 0-th level and the first level of conductors of a two-stages permutable switching network (2-PSN) with a more optimized switch coupling patterns between the 0-th level of conductors of I[0] number of conductors and the first level of conductors of I[1] number of conductors consisting of D[1] sets of intermediate conductors with I[0]=36, D[1]=2 and (I[0]×D[1])=72 switches.

By labeling the I[i−1] number of conductors sequentially as [1:I[i−1]] in the embodiment of FIG. 3A, namely, [1:36], with $D_S$[i]=(I[i−1]/I[i])×D[i]=2 and there are thus (I[i−1]/D[i])=18 groups of $D_S$[i]-tuples of the I[i−1] number of conductors, an "Original Sequence of the $D_S$[i]-tuples" can be constructed as (I[i−1]/D[i]) groups of $D_S$[i]-tuples as [1:18] corresponding to the eighteen consecutively labeled $D_S$[i]-tuples of the I[i−1] number of conductors {[1,2], [3,4], [5,6], [7,8], ... , [35,36]}; a "Transpose Sequence of the $D_S$[i]-tuples" of the Original Sequence (of the $D_S$[i]-tuples) can be constructed as the transpose of the Original Sequence, there are various values which can be used as the step used in the transpose such as $D_S$[i], D[i], (D[i]×$D_S$[i]), (I[i]/D[i] D[i]), $D_S$[i+1], etc., choosing $D_S$[i+1] as the step which is three in the embodiment of FIG. 3A, the Transpose Sequence (of the $D_S$[i]-tuples) with $D_S$[i+1] as the step is thus (1, 4, 7, 10, 13, 16, 2, 5, 8, 11, 14, 17, 3, 6, 9, 12, 15, 18), or respectively the first, fourth, tenth, ... , eighteenth $D_S$[i]-tuple of the 18 $D_S$[i]-tuples of I[i−1]; a "Prime 5 Sequence of the $D_S$[i]-tuples" can be constructed as the prime 5 distribution of the $D_S$[i]-tuples of the Original Sequence (of the 18 $D_S$[i]-tuples): (1, 6, 11, 16, 3, 8, 13, 18, 5, 10, 15, 2, 7, 12, 17, 4, 9, 14), or respectively the first, sixth, eleventh, ... , fourteenth $D_S$[i]-tuple of the 18 $D_S$[i]-tuples of I[i−1] where i=1.

Thus, the first set of 18 conductors [101:118] of the D[1] sets of conductors of I[1] number of conductors selectively couple to the 18 $D_S$[1]-tuples using the Transpose Sequence (of the 18 $D_S$[i]-tuples) where the first $D_S$[1]-tuple [1,2] couples to the first conductor 101 of the first D[1] set of conductors of I[1] number of conductors, the fourth $D_S$[1]-tuple [7,8] couples to the second conductor 102 of the first D[1] set of conductors, the seventh $D_S$[1]-tuple [13,14] couples to the third conductor 103 of the first D[1] set of conductors, etc. as illustrated in the embodiment of FIG. 3A. Similarly, the D[1]-th set of 18 conductors [119:136] of the D[1] sets of conductors of I[1] number of conductors couple to the 18 $D_S$[1]-tuples using the Prime 5 Sequence (of the 18 $D_S$[i]-tuples), where the first $D_S$[1]-tuple [1,2] couples to the first conductor 119 of the last D[1] set of conductors of I[1] number of conductors, the sixth $D_S$[1]-tuple [11,12] couples to the second conductor 120 of the last D[1] set of conductors, the eleventh $D_S$[1]-tuple [21,22] couples to the third conductor 121 of the last D[1] set of conductors, etc., as illustrated in FIG. 3A.

Figure 3B:
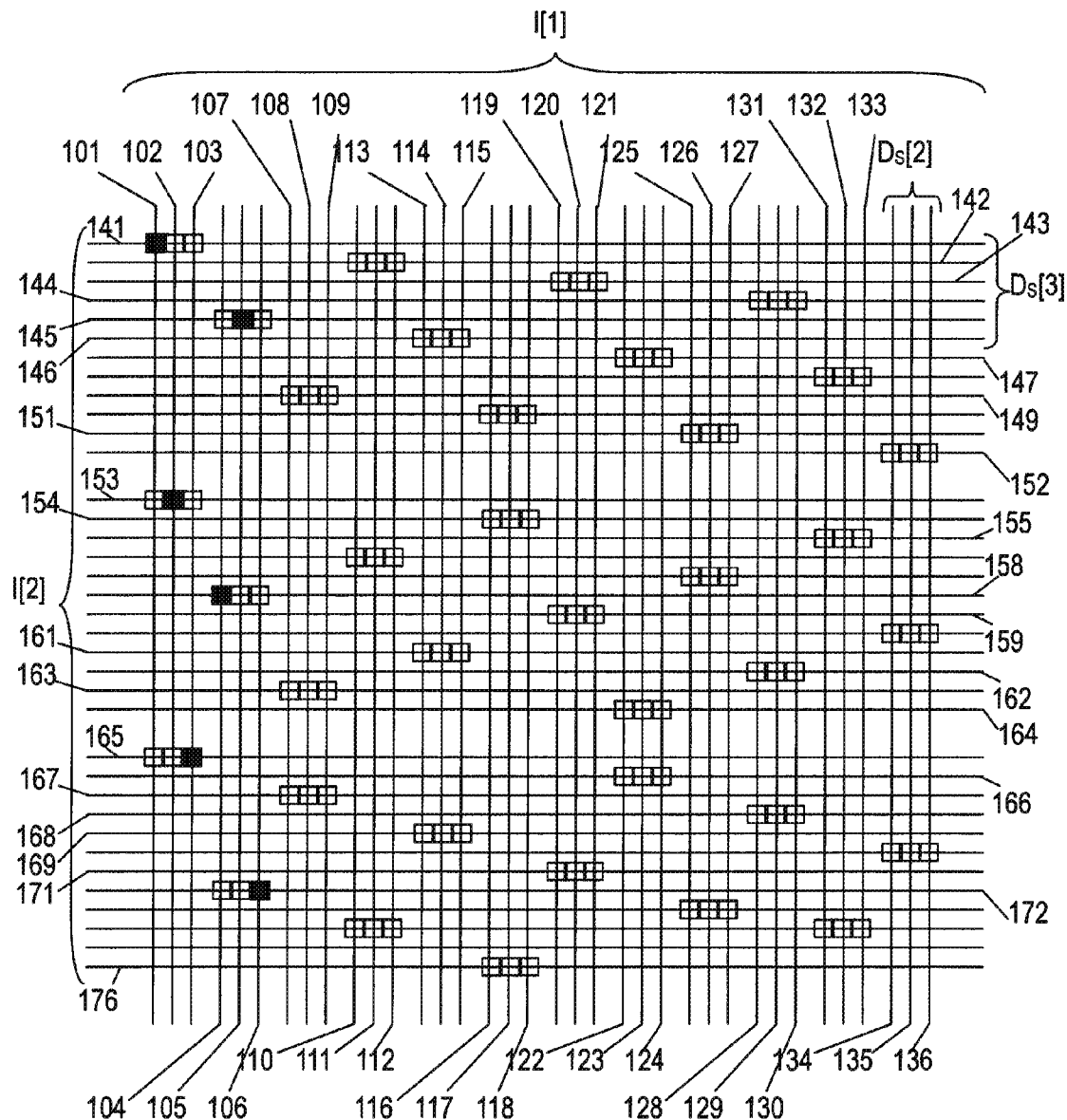
FIG. 3B illustrates an alternative embodiment of a L-PSN with L=2 of the first level and the second level of conductors of a two-stages permutable switching network (2-PSN) with a more optimized switch coupling patterns between the first level of conductors of I[1] number of conductors and the second level of conductors of I[2] number of conductors consisting of D[2] sets of intermediate conductors with I[1]=36, D[2]=3 and (I[1]×D[2])=108 switches.

Similarly, in the embodiment of FIG. 3B, where i=2, $D_S$[i]=D[i]=3, an "Original Sequence of the $D_S$[i]-tuples" can be constructed as (I[i−1]/D[i]) groups of $D_S$[i]-tuples as [1:12] corresponding to the twelve consecutively labeled $D_S$[i]-tuples of the I[i−1] number of conductors {[101:103], [104:106], [107:109], [110:112], ... , [134:136]}; a "Transpose Sequence of the $D_S$[i]-tuples" can be constructed as the transpose of the Original Sequence (of the 12 $D_S$[i]-tuples), there are various values which can be used as the step used in the transpose such as $D_S$[i], D[i], (D[i]×$D_S$[i]), (I[i]/D[i]/D[i]), $D_S$[i+1], etc., choosing $D_S$[i] as the step, which is three in the embodiment of FIG. 3B, the Transpose Sequence (of the 12 $D_S$[i]-tuples) is thus (1, 4, 7, 10, 2, 5, 8, 11, 3, 6, 9, 12), or respectively the first, fourth, tenth, ... , twelfth $D_S$[i]-tuple of the 12 $D_S$[i]-tuples of I[i−1]; a "Prime 5 Sequence of the $D_S$[i]-tuples" can be constructed as the prime 5 distribution of the Original Sequence (of the 12 $D_S$[i]-tuples): (1, 6, 11, 4, 9, 2, 7, 12, 5, 10, 3, 8), or respectively the first, sixth, eleventh, ... , eighth $D_S$[i]-tuple of the 12 $D_S$[i]-tuples of I[i−1]; a "Prime 7 Sequence of the $D_S$[i]-tuples" can be constructed as the prime 7 distribution of the Original Sequence (of the 12 $D_S$[i]-tuples): (1, 8, 3, 10, 5, 12, 7, 2, 9, 4, 11, 6), or respectively the first, eighth, third, ... , sixth $D_S$[i]-tuple of the 12 $D_S$[i]-tuples of I[i−1].

Thus, the first set of 12 conductors [141:152] of the D[2] sets of conductors of I[2] number of conductors couple to the 12 $D_S$[2]-tuples using the Transpose Sequence (of the 12 $D_S$[i]-tuples) where the first $D_S$[2]-tuple [101:103] couples to the first conductor 141 of the first D[2] set of conductors of I[2] number of conductors, the fourth $D_S$[2]-tuple [110:112] couples to the second conductor 142 of the first D[2] set of conductors, the seventh $D_S$[2]-tuple [119:121] couples to the third conductor 143 of the first D[2] set of conductors, etc. as illustrated in FIG. 3B.

The second set of 12 conductors [153:164] of the D[2] sets of conductors of I[2] number of conductors couple to the 12 $D_S$[2]-tuples using the Prime 5 Sequence (of the 12 $D_S$[i]-tuples), where the first $D_S$[2]-tuple [101:103] couples to the first conductor 153 of the second D[2] set of conductors of I[2] number of conductors, the sixth $D_S$[2]-tuple [116:118] couples to the second conductor 154 of the second D[2] set of conductors, the eleventh $D_S$[2]-tuple [131:133] couples to the third conductor 155 of the second D[2] set of conductors, etc., as illustrated in FIG. 3B.

The D[2]-th set of 12 conductors [165:176] of the D[2] sets of conductors of I[2] number of conductors couple to the 12 $D_S$[2]-tuples using the Prime 7 Sequence (of the 12 $D_S$[i]-tuples) where the first $D_S$[2]-tuple [101:103] couples to the first conductor 165 of the D[2]-th D[2] set of conductors of I[2] number of conductors, the eighth $D_S$[2]-tuple [122:124] couples to the second conductor 166 of the D[2]-th D[2] set of conductors, the third $D_S$[2]-tuple [107:109] couples to the third conductor 167 of the D[2]-th D[2] set of conductors, etc., as illustrated in FIG. 3B.

Figure 3C:
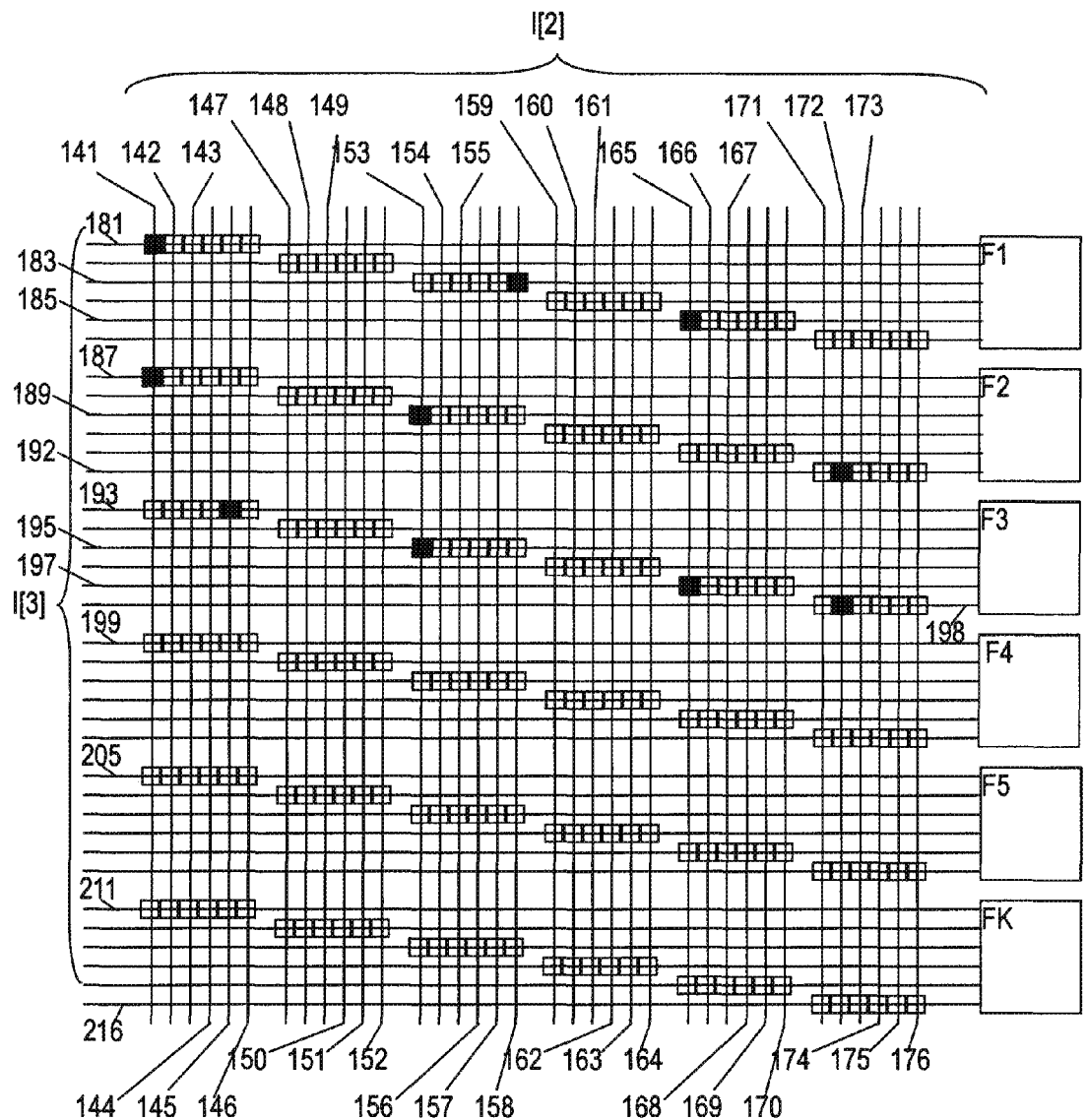
FIG. 3C illustrates one embodiment of a L-PSN with L=2 of the second level and the third level of conductors of a two-stages permutable switching network (2-PSN) having the same switch coupling patterns of the conventional embodiment of FIG. 1C with I[2]=36, D[3]=6 and (I[2]×D[3])=216 switches.

The couplings of the last two levels of conductors of the L-PSN of FIG. 3C has the same embodiment as the last two levels of switch couplings illustrated in the embodiment of FIG. 2C.

Using the same routing netlist of the six nets (of the two $D_S$[2]-tuples) illustrated above where net 101 has the connection specifications of (1, 2), net 101 has the connection specifications of (1, 2), net 102 has the connection specifications of (2, 3), net 103 has the connection specifications of (1, 3), net 104 has the connection specifications of (1), net 105 has the connection specifications of (3) and net 106 has the connection specifications of (2, 3) in FIG. 3B. Net 101 can connect to 141 of I[2] which in turn connects to 181 of F1 and 187 of F2, through switches illustrated by the blackened squares in FIG. 3B and FIG. 3C; Net 102 can connect to 153 of I[2] which in turn connects to 189 of F2 and 195 of F3, through switches illustrated by the blackened squares in FIG. 3B and FIG. 3C; Net 103 can connect to 165 of I[2] which in turn connects to 185 of F1 and 197 of F3, through switches illustrated by the blackened squares in FIG. 3B and FIG. 3C; Net 104 can connect to 158 of I[2] which in turn connects to 183 of F1, through switches illustrated by the blackened squares in FIG. 3B and FIG. 3C; net 105 can connect to 145 of I[2] which in turn connects to 193 of F3, through switches illustrated by the blackened squares in FIG. 3B and FIG. 3C; Net 106 can connect to 172 of I[2] which in turn connects to 192 of F2 and 198 of F3, through switches illustrated by the blackened squares in FIG. 3B and FIG. 3C.

The six connection specifications of signals originating at [101:106] or the two $D_S[2]$-tuples {[101:103], [104:106]} can be completed using the L-PSN illustrated in FIG. 3A through FIG. 3C while the same connection specification cannot be routed through the L-SN illustrated in FIG. 1A through FIG. 1C.

Figure 4:
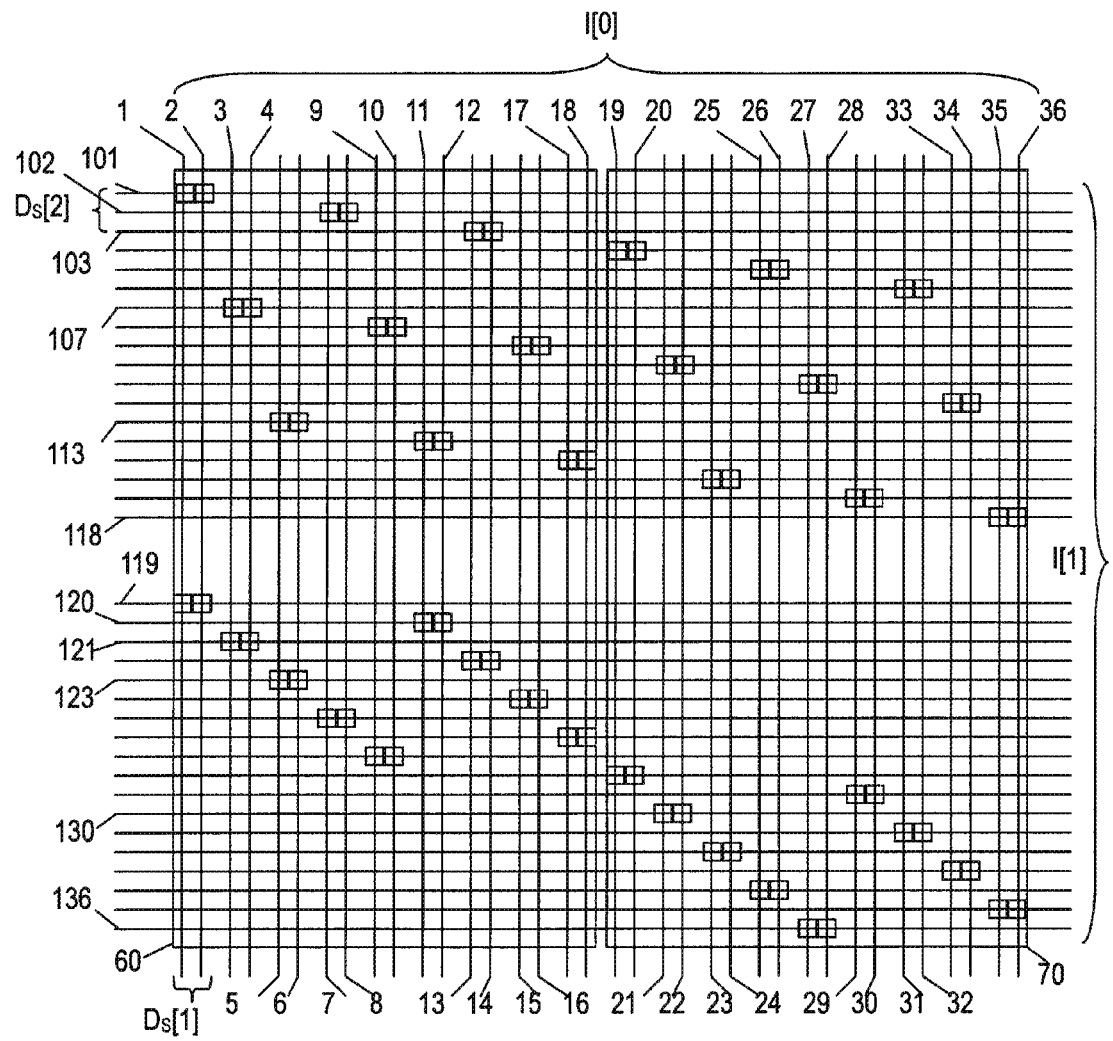
FIG. 4 illustrates one alternative embodiment with localized switch coupling patterns of FIG. 3A.

One embodiment of a more optimized L-PSN with respect to the PSN-(1) or PSN-(2) properties is illustrated in FIG. 3A and FIG. 4 where the first one is a global level representation of switch coupling patterns where $T=(I[i-1]/D_S[i]/D_S[i+1])=6$ between two consecutive levels of conductors while FIG. 4 is a localized representation of switch coupling patterns between two consecutive levels of conductors, where $T=3$ of the PSN-(D) formulations. Given any $D_S[i+1]$ groups of $D_S[i]$-tuples of $(T \times D_S[i+1])$ groups of $D_S[i]$-tuples of the $(i-1)$-th level of conductors of an L-PSN for an i selected from $i=[1:L+1]$, the $D_S[i+1]$ groups of $D_S[i]$-tuples selectively couple to $D_S[i+1]$ number of conductors in each of the $D[i]$ sets of conductors respectively having T groups of $D_S[i+1]$-tuples of the i-th level of conductors. The least case of overlaps with the $D_S[i+1]$-tuples occurs when the $D_S[i+1]$ number of conductors in each of the $D[i]$ sets of conductors belong to a minimum number of $D_S[i+1]$-tuples of the i-th level of conductors and in FIG. 3A, for $i=1$, the source $D_S[i]$-tuples (1, 2), (7, 8), (13, 14) are selective coupled to the $D_S[i+1]$ number of conductors of the first $D_S[i+1]$-tuple [101:103] of the first $D[i]$ sets of conductors and conductor 119 of the first $D_S[i+1]$-tuple [119:121], 131 of the fifth $D_S[i+1]$-tuple [131:133], 134 of the sixth $D_S[i+1]$-tuple [134:136] of the $D[i]$-th set of conductors, thus the $D_S[i+1]$ groups of $D_S[i]$-tuples of the $(i-1)$-th level of conductors selectively couple to the conductors of $D_S[i+1] \times (D[i]-1)+1=3+1=4$ groups of $D_S[i+1]$-tuples of the i-th level of conductors. Similarly, in the embodiment of FIG. 4, for $T=3=D_S[i+1]$, any $D_S[i+1]$ groups of $D_S[i]$-tuples of $(T \times D_S[i+1])$ groups of $D_S[i]$-tuples of the $(i-1)$-th level of conductors of $I[i-1]$ number of conductors selectively couple to the conductors of $(D_S[i+1] \times (D[i]-1)+1)=4$ groups of $D_S[i+1]$-tuples of the $D[i]$ sets of conductors respectively having T groups of $D_S[i+1]$-tuples of the i-th level of conductors; if T, the number of $D_S[i+1]$-tuples in each of the $D[i]$ sets of conductors, is less than $D_S[i+1]$, the above relations would not hold, instead, the number would be $(T \times (D[i]-1)+1)$ instead of $(D_S[i+1] \times (D[i]-1)+1)$.

The switch coupling patterns in the embodiment of FIG. 3B could have up to $(D_S[i+1] \times (D[i]-1)+1)$ groups of $D_S[i+1]$-tuples of the $D[i]$ sets of the i-th level of conductors selectively couple to any $D_S[i+1]$ groups of $D_S[i]$-tuples of the $(i-1)$-th level of conductors if the number of $D_S[i+1]$-tuples in each of the $D[i]$ sets of conductors is at least equal to $D_S[i+1]$; in the illustrated example of FIG. 3B, there are only $(I[i]/D[i]/D_S[i+1])=2$ groups of $D_S[i+1]$-tuples which is less than $D_S[i+1]=6$ thus there are at most $((I[i]/D[i]/D_S[i+1]) \times (D[i]-1)+1)=5$ groups of $D_S[i+1]$-tuples of the $D[i]$ sets of the i-th level of conductors selectively couple to any $D_S[i+1]$ groups of $D_S[i]$-tuples of the $(i-1)$-th level of conductors. Thus the PSN-(3) properties would require that there are at least $D_S[i+1]$ groups of $D_S[i+1]$-tuples in each of the $D[i]$ sets respectively having T groups of $D_S[i+1]$-tuples of the i-th level of conductors or T is at least $D_S[i+1]$ in the L-PSN.

Thus, one embodiment of a L-PSN of the type illustrated in the embodiments of FIG. 3A and FIG. 4 has the following properties:

PSN-(3): Any $D_S[i+1]$ groups of $D_S[i]$-tuples of $(T \times D_S[i+1])$ groups of $D_S[i]$—tuples of the $(i-1)$-th level of conductors of $I[i-1]$ number of conductors selectively couple to at least $(D_S[i+1] \times (D[i]-1)+1)$ groups of $D_S[i+1]$-tuples of the $D[i]$ sets respectively having T groups of $D_S[i+1]$-tuples of the i-th level of conductors for at least one i selected from $i=[1:L+1]$ for $T \geq D_S[i+1]$.

Note that every level of conductors must satisfy the PSN-(A) and PSN-(B) formulations for $i=[1:L+1]$ while it is only necessary to satisfy the PSN-(C) and PSN-(D) formulations for just one i selected from $i=[1:L+1]$ in an L-PSN according to one embodiment of the invention. Thus a L-PSN can have switch coupling patterns between two consecutive levels of conductors using either the conventional L-SN, the L-PSN of the U.S. patent application Ser. No. 12/327,702 by the present inventors or the L-PSN following the PSN-(A) through PSN-(D) formulations disclosed in this application.

Figure 5A:
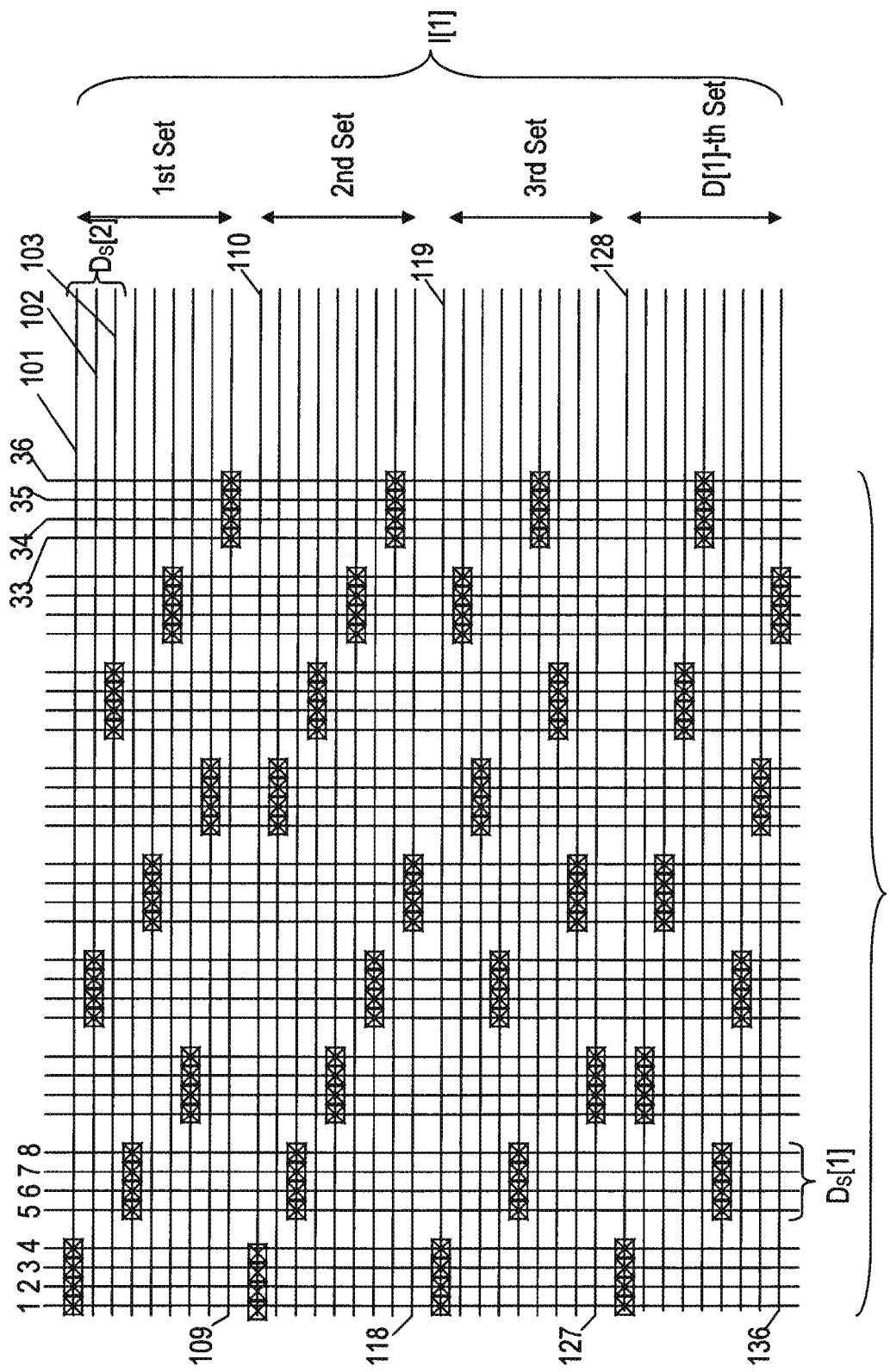
FIG. 5A illustrates one embodiment of a L-PSN with L=2 of the 0-th level and the first level of conductors of a two-stages permutable switching network (2-PSN) with global level switch coupling patterns between the 0-th level of conductors of I[0] number of conductors and the first level of conductors of I[1] number of conductors consisting of D[1] sets of intermediate conductors with I[0]=36, D[1]=4 and (I[0]×D[1])=144 switches.
Figure 5B:
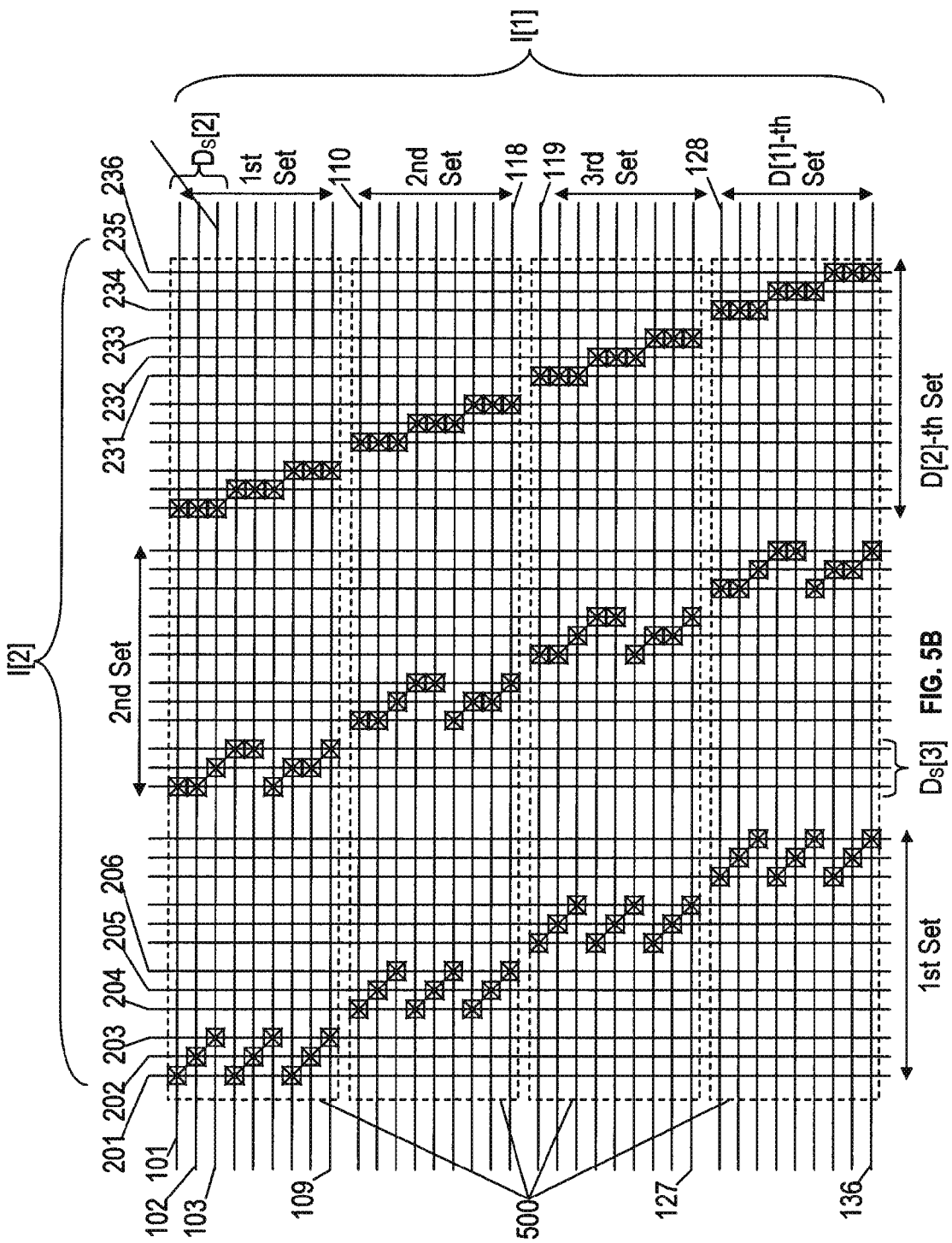
FIG. 5B illustrates an alternative embodiment of the first level and the second level of conductors of a two-stages permutable switching network (2-PSN) of FIG. 2A with localized switch coupling patterns between the first level of conductors of I[1] number of conductors and the second level of conductors of I[2] number of conductors consisting of D[2] sets of intermediate conductors with I[1]=36, D[2]=3 and (I[1]×D[2])=108 switches.
Figure 5C:
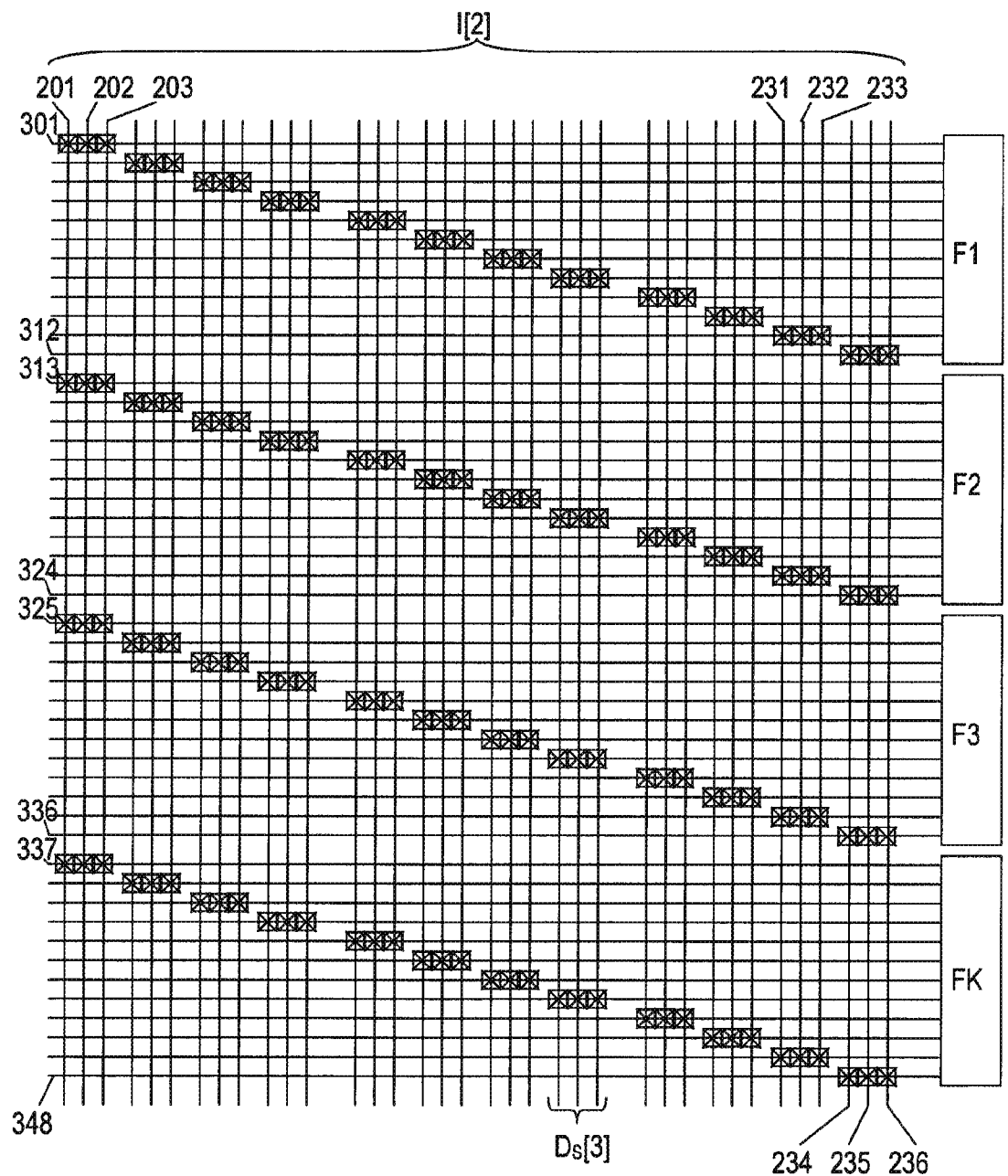
FIG. 5C illustrates one embodiment of the second level and the third level of conductors of a two-stages permutable switching network (2-PSN) of FIG. 2A and FIG. 2B with switch coupling patterns of the conventional design with I[2]=36, D[3]=4 and (I[2]×D[3])=144 switches.

The embodiments of FIG. 5A through FIG. 5C illustrates an L-PSN with $L=2$, $D[1]=D_S[1]=4$, $D[2]=D_S[2]=3$, $D[3]=4$, $D_S[3]=3$ and where not all the conductors of I[0], I[1], I[2] and I[3] are labeled, those conductors are assumed to be consecutively numbered and thus labeled as I[0]=[1:36], I[1]=[101:136], I[2]=[201:236] and I[3]=[301:348], where the L-PSN meets both the PSN-(A) through PSN-(D) formulations of the present disclosure and the PSN-(A) through PSN-(C) formulations of the U.S. patent application Ser. No. 12/327,702 by the present inventors.

The embodiment of FIG. 5A illustrates a global level of switch couplings of the present disclosure PSN-(A) through PSN-(D) formulations for $i=1$ between the 0-th level of conductors [1:36] and the first level of conductors [101:136], where the first of the D[1] sets of conductors are constructed with the Transpose Sequence of the $D_S[1]$-tuples using a step of $D_S[2]$, the second of the D[1] sets of conductors are constructed with the Prime 5 Sequence of the $D_S[1]$-tuples, the third of the D[1] sets of conductors are constructed with the Prime 7 Sequence of the $D_S[1]$-tuples and the D[1]-th set of the D[1] sets of conductors are constructed with the Prime 11 Sequence of the $D_S[1]$-tuples.

The embodiment of FIG. 5B illustrates a localized switch couplings of the other application, U.S. patent application Ser. No. 12/327,702 by the present inventors, with PSN-(A) through PSN-(C) formulations for $i=2$ between the first level of conductors [101:136] and the second level of conductors [201:236], where each of the D[1] sets of switches in 500 represents the localized switch couplings (between [101:109] and {[201:203], [213:215], [225:227]}, between [110:118] and {[204:206], [216:218], [228:230]}, between [119:127] and {[207:209], [219:221], [231:233]}, between [128:136] and {[210:212], [222:224], [234:236]}) where the first of the D[2] sets of $D_S[3]$ number of conductors are constructed with the Transpose Sequence (of conductors) using a step of $D_S[2]$, the second of the D[2] sets of conductors are constructed with the Prime 5 Sequence (of conductors) and the D[2]-th set of the D[1] sets of conductors are constructed with the Original Sequence (of conductors).

The embodiment of FIG. 5C has the same conventional L-SN switch couplings for $i=3$ between the second level of conductors and the third level of conductors.

The generalized L-PSN formulations illustrated so far always refers to $I[i-1]$ number of switches, which are used to selectively couple the conductors of an $(i-1)$-th level of conductors of $I[i-1]$ number of conductors to the conductors of each of the $D[i]$ sets of conductors of the i-th level of conductors of $I[i]$ number of conductors having $D[i]$ sets of conductors, where a subset of conductors of the $(i-1)$-level of conductors selectively couple to a subset of conductors of the i-th level of conductors prescribed by the formulations of PSN-(A) and PSN-(D) and has at least properties of PSN-(1), PSN-(2) or PSN-(3) for at least one i selected from i=[1:L+1]. An L-PSN can have many variations and the decisions to design a specific implementation of the L-PSN is generally based on the specific design or engineering objectives such as size, speed and ease of software to handle routing, etc.

The L-PSN switching networks can be used in conjunction with other interconnection mechanisms to form an interconnection fabric, for programmable logic circuits such as Field Programmable Gate Arrays (FPGAs) or used in a general interconnection network such as a network router. When an L-PSN is too small, there is no appreciable advantage, in terms of switch count, compared with many alternative interconnection schemes of the many conventional designs; for a 1-PSN, for example, both N=D[1] and K=D[L+1] should be at least three; for an L-PSN, at least one of the D[i] should be greater than two and $D_S[i]$ in general should be at least two where L is greater than one.

Thus the L-PSN scheme can be used to enhance the selective connectivity or routability of a netlist compared to a corresponding conventional L-SN when there are one or more multicasting signals without adding more switches or conductors to the switching network. Using numerous embodiments and illustrations, a detailed description in building various enhanced multistage permutable switching networks is provided and used in various combinations to provide interconnect, both for inputs and outputs, for programmable logic circuits.

In some embodiments, the design and/or layout of the integrated circuits described above can be performed by a computing machine (e.g., a server, a personal computer, etc.) in response to instructions embodied in a machine-readable storage medium of an article of manufacture. Some examples of a machine-readable storage medium include any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus. Furthermore, data representing the design and/or layout of the integrated circuits described above can be embodied in a machine-readable storage medium of an article of manufacture.

Thus, some embodiments of permutable switching network have been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit, comprising: a L-level permutable switching network (L-PSN);
   wherein the L-PSN comprises (L+2) levels of conductors and (L+1) sets of switches:
      wherein the (L+2) levels of conductors comprises:
         for i=[1:L], (I[i]/D[i])>1, D[i]>1, L≧1, at least one j where D[j]>2 for j selected from j=[1:L], each of the i-th level of conductors comprises I[i] number of conductors comprising D[i] sets of conductors,
         an 0-th level of conductors of I[0] number of conductors,
            wherein $(I[0]/\Pi_{i=[1:L]}D[i])>1$;
         an (L+1)-th level of conductors of I[L+1] number of conductors comprising D[L+1] sets of conductors, wherein D[L+1]>2 and $(I[L+1]/D[L+1])=\Pi_{i=[1:L]}D[i]$;
      wherein each i-th set of the (L+1) sets of switches comprises (I[i−1]×D[i]) number of switches for i=[1:L+1];
      wherein the I[i−1] number of conductors of the (i−1)-th level of conductors selectively couple to (I[i]/D[i]) number of conductors in each of the D[i] sets of conductors of the i-th level of conductors through a respective I[i−1] number of switches of the i-th set of switches for i=[1:L+1];
      for an j selected from j=[1:L] and $D_S[j]=(I[j−1]/I[j]×D[j]$, the I[j−1] number of conductors of the (j−1)-th level of conductors comprising $(I[j−1]/D_S[j])$ groups of $D_S[j]$ number of conductors,
      wherein each of the $D_S[j]$ number of conductors of the $(I[j−1]/D_S[j])$ groups selectively couple to one conductor in each of the D[j] sets of conductors of the j-th level of conductors through a respective $D_S[j]$ number of switches of the respective I[j−1] number of switches of the j-th set of switches;
      wherein the $\Pi_{i=[1:L]}D[i]$ number of conductors in each of the D[L+1] sets of conductors of the (L+1)-th level of conductors are physically connected to a corresponding number of pins of a corresponding module; and
      for T>1 and L>1, any $D_S[j+1]$ groups of $D_S[j]$ number of conductors of $(T×D_S[j+1])$ groups of $D_S[j]$ number of conductors of the (j−1)-th level of conductors selectively couple to $D_S[j+1]$ number of conductors in each of the D[j] sets of conductors of T groups of $D_S[j+1]$ number of conductors of the j-th level of conductors of D[j] sets of conductors through a respective $(D_S[j+1]×D_S[j]×D[j])$ number of switches,
      wherein the $D_S[j+1]$ groups of $D_S[j]$ number of conductors selectively couple to the conductors of at least two groups of $D_S[j+1]$ number of conductors of at least one of the D[j] sets of conductors of the T groups of $D_S[j+1]$ number of conductors through a respective $(D_S[j+1]×D_S[j])$ number of switches of the $(D_S[j+1]×D_S[j]×D[j])$ number of switches.

2. The integrated circuit of claim 1, wherein any $D_S[j+1]$ groups of $D_S[j]$ number of conductors of the $(T×D_S[j+1])$ groups of $D_S[j]$ number of conductors selectively couple to conductors of at least (D[j]+1) groups of $D_S[j+1]$ number of conductors of the T groups of $D_S[j+1]$ number of conductors of the D[j] sets of conductors,
   wherein the at least (D[j]+1) groups of $D_S[j+1]$ number of conductors comprises at least one group of $D_S[j+1]$ number of conductors from each of the D[j] sets of conductors of the T groups of $D_S[j+1]$ number of conductors.

3. The integrated circuit of claim 1, wherein any $D_S[j+1]$ groups of $D_S[j]$ number of conductors of the $(T×D_S[j+1])$ groups of $D_S[j]$ number of conductors selectively couple to conductors of at least (2D[j]−1) groups of $D_S[j+1]$ number of conductors of the T groups of $D_S[j+1]$ number of conductors of the D[j] sets of conductors,
   wherein the at least (2D[j]−1) groups of $D_S[j+1]$ number of conductors comprises at least one group of $D_S[j+1]$ number of conductors from each of the D[j] sets of conductors of the T groups of $D_S[j+1]$ number of conductors.

4. The integrated circuit of claim 1, wherein for T≧$D_S[j+1]$, any $D_S[j+1]$ groups of $D_S[j]$ number of conductors of the $(T×D_S[j+1])$ groups of $D_S[j]$ number of conductors selectively couple to conductors of at least $(D_S[j+1]×(D[j]−1)+1)$ groups of $D_S[j+1]$ number of conductors of the T groups of $D_S[j+1]$ number of conductors of the D[j] sets of conductors, wherein the at least ($D_S[j+1] \times (D[j]-1)+1$) groups of $D_S[j+1]$ number of conductors comprises at least one group of $D_S[j+1]$ number of conductors from each of the D[j] sets of conductors of the T groups of $D_S[j+1]$ number of conductors.

5. A method to manufacture an integrated circuit, comprising:
fabricating a L-level permutable switching network (L-PSN),
wherein the L-PSN comprises (L+2) levels of conductors and (L+1) sets of switches:
wherein the (L+2) levels of conductors comprises:
for i=[1:L], (I[i]/D[i])>1, D[i]>1, L≧1, at least one j where D[j]>2 for j selected from j=[1:L], each of the i-th level of conductors comprises I[i] number of conductors comprising D[i] sets of conductors,
an 0-th level of conductors of I[0] number of conductors,
wherein (I[0]/$\Pi_{i=[1:L]}$D[i])>1;
an (L+1)-th level of conductors of I[L+1] number of conductors comprising D[L+1] sets of conductors,
wherein D[L+1]>2 and (I[L+1]/D[L+1])= $\Pi_{i=[1:L]}$D[i];
wherein each i-th set of the (L+1) sets of switches comprises (I[i−1]×D[i]) number of switches for i=[1:L+1];
selectively coupling the I[i−1] number of conductors of the (i−1)-th level of conductors to (I[i]/D[i]) number of conductors in each of the D[i] sets of conductors of the i-th level of conductors through a respective I[i−1] number of switches of the i-th set of switches for i=[1:L+1];
for an j selected from j=[1:L] and $D_S[j]$=(I[j−1]/I[j])×D[j], the I[j−1] number of conductors of the (j−1)-th level of conductors comprising (I[j−1]/$D_S[j]$) groups of $D_S[j]$ number of conductors,
selectively coupling each of the $D_S[j]$ number of conductors of the (I[j−1]/$D_S[j]$) groups to one conductor in each of the D[j] sets of conductors of the j-th level of conductors through a respective $D_S[j]$ number of switches of the respective I[j−1] number of switches;
physically connecting the $\Pi_{i=[1:L]}$D[i] number of conductors in each of the D[L+1] sets of conductors of the (L+1)-th level of conductors to a corresponding number of pins of a corresponding module; and
for T>1 and L>1, selectively coupling any $D_S[j+1]$ groups of $D_S[j]$ number of conductors of (T×$D_S[j+1]$) groups of $D_S[j]$ number of conductors of the (j−1)-th level of conductors to $D_S[j+1]$ number of conductors in each of the D[j] sets of conductors of T groups of $D_S[j+1]$ number of conductors of the j-th level of conductors of D[j] sets of conductors through a respective ($D_S[j+1] \times D_S[j] \times D[j]$) number of switches,
selectively coupling the $D_S[j+1]$ groups of $D_S[j]$ number of conductors to the conductors of at least two groups of $D_S[j+1]$ number of conductors of at least one of the D[j] sets of conductors of the T groups of $D_S[j+1]$ number of conductors through a respective ($D_S[j+1] \times D_S[j]$) number of switches of the ($D_S[j+1] \times D_S[j] \times D[j]$) number of switches.

6. The method of claim 5, further comprising selectively coupling any $D_S[j+1]$ groups of $D_S[j]$ number of conductors of the (T×$D_S[j+1]$) groups of $D_S[j]$ number of conductors to conductors of at least (D[j]+1) groups of $D_S[j+1]$ number of conductors of the T groups of $D_S[j+1]$ number of conductors of the D[j] sets of conductors,
wherein the at least (D[j]+1) groups of $D_S[j+1]$ number of conductors comprises at least one group of $D_S[j+1]$ number of conductors from each of the D[j] sets of conductors of the T groups of $D_S[j+1]$ number of conductors.

7. The method of claim 5, further comprising selectively coupling any $D_S[j+1]$ groups of $D_S[j]$ number of conductors of the (T×$D_S[j+1]$) groups of $D_S[j]$ number of conductors to conductors of at least (2D[j]−1) groups of $D_S[j+1]$ number of conductors of the T groups of $D_S[j+1]$ number of conductors of the D[j] sets of conductors,
wherein the at least (2D[j]−1) groups of $D_S[j+1]$ number of conductors comprises at least one group of $D_S[j+1]$ number of conductors from each of the D[j] sets of conductors of the T groups of $D_S[j+1]$ number of conductors.

8. The method of claim 5, further comprising selectively coupling for T≧$D_S[j+1]$, any $D_S[j+1]$ groups of $D_S[j]$ number of conductors of the (T×$D_S[j+1]$) groups of $D_S[j]$ number of conductors to conductors of at least ($D_S[j+1] \times (D[j]-1)+1$) groups of $D_S[j+1]$ number of conductors of the T groups of $D_S[j+1]$ number of conductors of the D[j] sets of conductors,
wherein the at least ($D_S[j+1] \times (D[j]-1)+1$) groups of $D_S[j+1]$ number of conductors comprises at least one group of $D_S[j+1]$ number of conductors from each of the D[j] sets of conductors of the T groups of $D_S[j+1]$ number of conductors.

9. An article of manufacture comprising a machine readable storage medium that stores data representing an integrated circuit layout, comprising: a L-level permutable switching network (L-PSN);
wherein the L-PSN comprises (L+2) levels of conductors and (L+1) sets of switches:
wherein the (L+2) levels of conductors comprises:
for i=[1:L], (I[i]/D[i])>1, D[i]>1, L≧1, at least one j where D[j]>2 for j selected from j=[1:L], each of the i-th level of conductors comprises I[i] number of conductors comprising D[i] sets of conductors,
an 0-th level of conductors of I[0] number of conductors,
wherein (I[0]$\Pi_{i=[1:L]}$D[i])>1;
an (L+1)-th level of conductors of I[L+1] number of conductors comprising D[L+1] sets of conductors,
wherein D[L+1]>2 and (I[L+1]/D[L+1])=$\Pi_{i=[1:L]}$D[i];
wherein each i-th set of the (L+1) sets of switches comprises (I[i−1]×D[i]) number of switches for i=[1:L+1];
wherein the I[i−1] number of conductors of the (i−1)-th level of conductors selectively couple to (I[i]/D[i]) number of conductors in each of the D[i] sets of conductors of the i-th level of conductors through a respective I[i−1] number of switches of the i-th set of switches for i=[1:L+1];
for an j selected from j=[1:L] and $D_S[j]$=(I[j−1]/I[j])×D[j], the I[j−1] number of conductors of the (j−1)-th level of conductors comprising (I[j−1]$D_S[j]$) groups of $D_S[j]$ number of conductors,
wherein each of the $D_S[j]$ number of conductors of the (I[j−1]/$D_S[j]$) groups selectively couple to one conductor in each of the D[j] sets of conductors of the j-th level of conductors through a respective $D_S[j]$ number of switches of the respective I[j−1] number of switches;
wherein the $\Pi_{i=[1:L]}$D[i] number of conductors in each of the D[L+1] sets of conductors of the (L+1)-th level of conductors are physically connected to a corresponding number of pins of a corresponding module; and for T>1 and L>1, any $D_S[j+1]$ groups of $D_S[j]$ number of conductors of $(T \times D_S[j+1])$ groups of $D_S[j]$ number of conductors of the (j−1)-th level of conductors selectively couple to $D_S[j+1]$ number of conductors in each of the D[j] sets of conductors of T groups of $D_S[j+1]$ number of conductors of the j-th level of conductors of D[j] sets of conductors through a respective $(D_S[j+1] \times D_S[j] \times D[j])$ number of switches, wherein the $D_S[j+1]$ groups of $D_S[j]$ number of conductors selectively couple to the conductors of at least two groups of $D_S[j+1]$ number of conductors of at least one of the D[j] sets of conductors of the T groups of $D_S[j+1]$ number of conductors through a respective $(D_S[j+1] \times D_S[j])$ number of switches of the $(D_S[j+1] \times D_S[j] \times D[j])$ number of switches.

10. The article of manufacture of claim 9, wherein any $D_S[j+1]$ groups of $D_S[j]$ number of conductors of the $(T \times D_S[j+1])$ groups of $D_S[j]$ number of conductors selectively couple to conductors of at least (D[j]+1) groups of $D_S[j+1]$ number of conductors of the T groups of $D_S[j+1]$ number of conductors of the D[j] sets of conductors, wherein the at least (D[j]+1) groups of $D_S[j+1]$ number of conductors comprises at least one group of $D_S[j+1]$ number of conductors from each of the D[j] sets of conductors of the T groups of $D_S[j+1]$ number of conductors.

11. The article of manufacture of claim 9, wherein any $D_S[j+1]$ groups of $D_S[j]$ number of conductors of the $(T \times D_S[j+1])$ groups of $D_S[j]$ number of conductors selectively couple to conductors of at least (2D[j]−1) groups of $D_S[j+1]$ number of conductors of the T groups of $D_S[j+1]$ number of conductors of the D[j] sets of conductors, wherein the at least (2D[j]−1) groups of $D_S[j+1]$ number of conductors comprises at least one group of $D_S[j+1]$ number of conductors from each of the D[j] sets of conductors of the T groups of $D_S[j+1]$ number of conductors.

12. The article of manufacture of claim 9, wherein for $T \geq D_S[j+1]$, any $D_S[j+1]$ groups of $D_S[j]$ number of conductors of the $(T \times D_S[j+1])$ groups of $D_S[j]$ number of conductors selectively couple to conductors of at least $(D_S[j+1] \times (D[j]−1)+1)$ groups of $D_S[j+1]$ number of conductors of the T groups of $D_S[j+1]$ number of conductors of the D[j] sets of conductors, wherein the at least $(D_S[j+1] \times (D[j]−1)+1)$ groups of $D_S[j+1]$ number of conductors comprises at least one group of $D_S[j+1]$ number of conductors from each of the D[j] sets of conductors of the T groups of $D_S[j+1]$ number of conductors.

\* \* \* \* \*